United States Patent
Zimmerman et al.

(10) Patent No.: US 12,139,635 B2
(45) Date of Patent: Nov. 12, 2024

(54) COATINGS FOR WATERPROOFING ELECTRONIC COMPONENTS

(71) Applicant: Henkel AG & Co. KGaA, Duesseldorf (DE)

(72) Inventors: John L. Zimmerman, Taylor, MI (US); John D. McGee, Troy, MI (US); Gregory T. Donaldson, Sterling Heights, MI (US); Thomas S. Smith, II, Novi, MI (US); William G. Kozak, Waterford, MI (US); Lisa K. Miller, Clinton Township, MI (US); Eric C. Kuhns, Washington, MI (US)

(73) Assignee: Henkel AG & Co. KGaA, Duesseldorf (DE)

( * ) Notice: Subject to any disclaimer, the term of this patent is extended or adjusted under 35 U.S.C. 154(b) by 38 days.

(21) Appl. No.: 17/448,404

(22) Filed: Sep. 22, 2021

(65) Prior Publication Data
US 2022/0002559 A1    Jan. 6, 2022

Related U.S. Application Data

(63) Continuation of application No. PCT/US2020/023764, filed on Mar. 20, 2020.
(Continued)

(51) Int. Cl.
*C09D 7/65* (2018.01)
*C09D 4/06* (2006.01)
(Continued)

(52) U.S. Cl.
CPC ................. *C09D 5/00* (2013.01); *C09D 4/06* (2013.01); *C09D 7/20* (2018.01); *C09D 7/65* (2018.01);
(Continued)

(58) Field of Classification Search
CPC ... C09D 5/00; C09D 7/65; C09D 7/20; C09D 4/06; C09D 109/02; C09D 135/02; C09D 153/00; H05K 3/282; H05K 3/284
See application file for complete search history.

(56) References Cited

U.S. PATENT DOCUMENTS

| | | |
|---|---|---|
| 2002/0042470 A1 | 4/2002 | Moore et al. |
| 2007/0007144 A1 | 1/2007 | Schetty |

(Continued)

FOREIGN PATENT DOCUMENTS

| | | |
|---|---|---|
| CN | 106030763 A | 10/2016 |
| DE | 3213384 A1 | 12/1982 |

(Continued)

OTHER PUBLICATIONS

Yu et al ("Simple Synthesis Hydrogenated Castor Oil Fatty Amide Wax and Its Coating Characterization", Journal of Oleo Science, 66, (7) 659-665, 2017). (Year: 2017).*

(Continued)

*Primary Examiner* — Robert S Jones, Jr.
*Assistant Examiner* — Jiangtian Xu
(74) *Attorney, Agent, or Firm* — Mary K. Cameron

(57) ABSTRACT

A circuit board water-proofing coating composition is provided comprising: at least one passivating agent, preferably containing a molecule comprising a thio-functional group, desirably a thiol group, an azolic moiety, or an azole, and combinations thereof; at least one binder component comprising an organic or inorganic film-forming polymer, and/or one or more polymer pre-cursors polymerizable on a substrate surface; and optionally one or more additive(s); also provided are methods of making and using the coating composition and coated circuit boards.

25 Claims, 2 Drawing Sheets

Related U.S. Application Data

(60) Provisional application No. 62/822,545, filed on Mar. 22, 2019.

(51) Int. Cl.
*C09D 5/00* (2006.01)
*C09D 7/20* (2018.01)
*C09D 109/02* (2006.01)
*C09D 135/02* (2006.01)
*C09D 153/00* (2006.01)
*H05K 3/28* (2006.01)

(52) U.S. Cl.
CPC .......... *C09D 109/02* (2013.01); *C09D 135/02* (2013.01); *C09D 153/00* (2013.01); *H05K 3/282* (2013.01); *H05K 3/284* (2013.01)

(56) References Cited

U.S. PATENT DOCUMENTS

| | | | | |
|---|---|---|---|---|
| 2007/0015893 | A1* | 1/2007 | Hakuta | C08L 83/00 528/34 |
| 2010/0193777 | A1 | 8/2010 | Takahashi et al. | |
| 2017/0002107 | A1 | 1/2017 | Markou et al. | |
| 2017/0247334 | A1 | 8/2017 | Ishikawa et al. | |

FOREIGN PATENT DOCUMENTS

| | | |
|---|---|---|
| JP | H0459242 A | 2/1992 |
| JP | H05299822 A | 11/1993 |
| JP | H08311658 A | 11/1996 |
| JP | 200111664 A | 1/2001 |
| JP | 2002037942 A | 2/2002 |
| JP | 2004149611 A | 5/2004 |
| JP | 2005162986 A | 6/2005 |
| JP | 2005171091 A | 6/2005 |
| JP | 2008050609 A | 3/2008 |
| JP | 2009215477 A | 9/2009 |
| JP | 2011122051 A | 6/2011 |
| JP | 2013104012 A | 5/2013 |
| JP | 2013147699 A | 8/2013 |
| JP | 2015010113 A | 1/2015 |
| JP | 2015178585 A | 10/2015 |
| JP | 2018505925 A1 | 3/2018 |
| KR | 1020040073527 A | 8/2004 |
| KR | 1020050087967 A | 9/2005 |
| KR | 1020140096707 A | 8/2014 |
| WO | 03093534 A1 | 11/2003 |
| WO | 2009067446 A1 | 5/2009 |
| WO | 2013151003 A1 | 10/2013 |

OTHER PUBLICATIONS

Nair et al ("The Thiol-Michael Addition Click Reaction: A Powerful and Widely Used Tool in Materials Chemistry", Chemistry of Materials, 2013, vol. 26. (Year: 2013).*

International Search Report for PCT/EP2020/023764 mailed Jul. 13, 2020.

SCS Parylene Properties, Copyright 2007 Specialty Coating Systems, Inc., 12 pages.

* cited by examiner

COATINGS FOR WATERPROOFING ELECTRONIC COMPONENTS

TECHNICAL FIELD

This disclosure relates generally to so called "waterproofing" coating compositions, which increase water resistance of coated substrates by depositing thin and ultra-thin coating layers; the coating compositions are useful in coating electronic components, in particular circuit boards. The coating compositions comprise at least one passivating agent for passivating metal components of the circuit board, and one or more film forming polymers and/or polymer precursors, which deposit a passivating polymeric coating forming water resistant layer(s). The disclosure is also directed to methods of making such coating compositions, methods of depositing a passivating polymeric coating on substrates, and to electronic components, in particular circuit boards, coated with a passivating polymeric coating, preferably ultra-thin water resistant layer(s).

BACKGROUND OF THE DISCLOSURE

This section provides background information which is not necessarily prior art to the inventive concepts associated with the present disclosure.

Many substrate surfaces benefit from various types of coatings, including functional layers, e.g. layers that improve corrosion resistance and/or form a water-resistant coating. Water-resistant conformal coatings find special use in application to electronic components such as printed circuit boards (PCB), an essential building block of electronics systems such as tablets, cell phones and the like.

Printed circuit boards mechanically support and electrically connect electronic components on the boards using conductive traces adhered or otherwise attached to a non-conductive substrate. The conductive traces are generally metal traces of copper, aluminum and other conductive metal elements. It has become increasingly important to achieve moisture resistant printed circuit boards (PCB), and to maintain functionality in a range of service environments, particularly in the handheld electronics markets. Attempts to protect electronics often use some form of conformal coating over the entire printed circuit board. Conformal coating material is typically a polymeric film which conforms to the contours of a printed circuit board to provide barrier protection to the board's components. To provide barrier protection, conformal coatings typically are about 50-250 µm (micrometers) thick after drying, which is about 1 mil-10 mils dry coating thickness. The coating add-on mass increases device weight, which manufacturers seek to minimize particularly in in handheld devices. Such polymeric coating thickness also tends to impede heat dissipation which is also undesirable. Some conformal coating compositions also have the drawback of containing volatile solvents, which are evaporated to form the final coating. Volatile organic compounds as used herein mean any compound of carbon excluding CO, $CO_2$, carbonic acid, metallic carbides or carbonates and ammonium carbonates, which participates in atmospheric photochemical reactions, except those designated by the EPA as having negligible photochemical reactivity, see EPA.gov).

Protective thin coatings have been provided by vacuum processes such as chemical vapor deposition (CVD), in which both solid and volatile products are formed from a volatile precursor through chemical reactions, and the solid products are deposited on the substrate. However vacuum processing builds coating thickness slowly, a disadvantage for fast-moving electronics manufacturing. The vacuum processes also have economic drawbacks of requiring specialized chambers and environmental drawbacks in the use of volatile precursors.

Thus, there is a need for a coating composition capable of rapid, water-resistant coating deposition and a deposition method that passivates corrosion prone metal traces, providing light-weight and cost effective protection to electronic components, does not require a vacuum during application. Such a coating composition will preferably be applicable to electronics and in particular to printed circuit boards.

SUMMARY OF THE DISCLOSURE

Applicants have developed coating compositions and a process for applying them which provides better waterproof performance at reduced thickness compared to conformal coatings and avoids the slow application process and complex equipment associated with CVD and other vacuum deposition processes, among other benefits as will become evident from reading the below description. Coating compositions, methods of coating and coated substrates that overcome one or more of the above described disadvantages are provided.

In one aspect of the disclosure (Aspect 1), a circuit board water-proofing coating composition is provided which is comprised of, consists essentially of, or consists of:
(A) at least one dissolved and/or dispersed passivating agent; (B) at least one dissolved and/or dispersed binder component comprising an organic or inorganic film-forming polymer; and/or one or more polymer pre-cursors polymerizable on a substrate surface; wherein the film-forming polymer and/or the one or more polymer pre-cursors is 1) reactive with (A) or 2) is unreactive with (A); and optionally (C) one or more dissolved and/or dispersed additive(s), selected from wax, adhesion promoter, flow modifier, wetting agent, rheology modifier, stabilizer, catalyst, photoinitiator, biocide and biostat; and (D) at least one solvent or a solvent system comprising organic solvent.

In a similar aspect (Aspect 2), a circuit board water-proofing coating composition is provided which is comprised of, consists essentially of, or consists of:
(A) at least one dissolved and/or dispersed passivating agent, preferably containing a molecule comprising a thio-functional group, preferably a thiol group; an azolic moiety; or an azole, and combinations thereof; (B) a dissolved and/or dispersed binder component comprising one or more of the following types of binders: 1) an organic or inorganic film-forming polymer that is unreactive with (A); 2) an organic or inorganic film-forming polymer, which is capable of reacting with (A); 3) one or more polymer pre-cursors, e.g. monomers, oligomers and/or pre-polymers, polymerizable on a substrate surface and unreactive to (A); 4) one or more polymer pre-cursors, e.g. monomers, oligomers and/or pre-polymers, polymerizable on a substrate surface and capable of reacting with (A); and (C) optionally, one or more dissolved and/or dispersed additive(s), selected from wax, adhesion promoter, leveling agent, flow modifier, wetting agent, rheology modifier, stabilizer, catalyst, pigment, photoinitiator, biocide and biostat; and (D) optionally at least one organic solvent.

Aspect 3: The circuit board water-proofing coating composition of Aspect 1 or 2, wherein the passivating agent (A) is different from the binder component (B); (A) is present in an amount of about 0.5 to about 60 wt. %; (B) is present in an amount of about 1 wt. % to about 97 wt. %; (C) is present in an amount of about 1-80 wt. %; and the remainder to 100 wt. % being (D) at least one organic solvent, all based on a total weight of the coating composition.

Aspect 4: The circuit board water-proofing coating composition of any one of Aspects 1-3, wherein at least a portion of the passivating agent (A) comprises the thiol group; azolic moiety; or azole; and further comprises a secondary functional group.

Aspect 5: The circuit board water-proofing coating composition of any one of Aspects 1-4, wherein at least a portion of the binder component (B) is grafted to at least some molecules of the passivating agent (A).

Aspect 6: The circuit board water-proofing coating composition of any one of Aspects 1-4, wherein the organic or inorganic film-forming polymer of (B) comprises a polymer or copolymer of olefin monomer(s) and vinyl ester(s), preferably a block copolymer, most preferably an ethylene vinyl acetate copolymer.

Aspect 7: The circuit board water-proofing coating composition of any one of Aspects 1~4 wherein the one or more polymer pre-cursors comprise UV-curable monomers, oligomers and/or pre-polymers.

Aspect 8: The circuit board water-proofing coating composition of any one of Aspects 1-7 wherein (A) comprises molecules having both a thiol functional group and an azolic moiety.

Aspect 9: The circuit board water-proofing coating composition of any one of Aspects 1-8 wherein (A) comprises a mercapto silane oligomer.

Aspect 10: The circuit board water-proofing coating composition of any one of Aspects 1-9 wherein (C) comprises a wax having a melting point of about 50 to 100° C.

Aspect 11: The circuit board water-proofing coating composition of any one of Aspects 1-10 wherein the one or more polymer pre-cursors includes olefinic monomer comprising at least one of (meth)acrylate monomer(s), a vinyl monomer(s), styrene(s), acrylonitrile(s), and mixtures thereof.

Another aspect of the disclosure (Aspect 12) is provided which is comprised of, consists essentially of, or consists of a method of waterproofing a circuit board comprising steps of: a) applying the coating composition according to any one of the foregoing Aspects to a substrate surface, optionally comprising one or more electrically conductive traces affixed thereto, preferably the substrate is an electronic component, more preferably a circuit board, most preferably a printed circuit board; b) drying the coating composition on the substrate surface; c) optionally UV curing the coating composition on the substrate surface; during any of steps a)-c) reacting available reactive functional groups of binder component (B) and passivating agent (A) with coating composition components and optionally the electrically conductive traces, preferably metal traces, thereby depositing a passivating polymeric film, insoluble in water on the substrate surfaces. A related aspect (Aspect 13) provides a passivating polymeric film deposited on a circuit board according to the method of Aspect 12, wherein the film is removable from the circuit board by peeling. Another related aspect (Aspect 14) provides an electronic component, preferably a circuit board, coated according to Aspect 12, wherein the electronic component shows no current leakage during immersion in distilled water for 30 minutes under applied electrical power of 3, preferably 10, more preferably 20, most preferably 30 Volts.

Another aspect of the disclosure (Aspect 15) which is comprised of, consists essentially of, or consists of a method of water-proofing a circuit board which is comprised of, consists essentially of, or consists of steps of: (a) providing a liquid coating composition comprising: (A) passivating agent(s); (B1) an organic or inorganic film-forming polymer; and/or (B2) one or more polymer pre-cursors polymerizable on a substrate surface; and optionally: (C) additive(s); (b) applying the coating composition onto an exposed surface of the circuit board and maintaining the composition in a liquid state thereby by enabling reaction and adsorption of (A) to metal portions of the surface; and (c) solidifying, for example removing solvent from the layer, and optionally curing, the composition to form an ultra-thin film having a thickness sufficient to render the surface waterproof. The final coating may have a thickness ranging from about 0.2 to 1.6 μm, 0.6 to 15 micron or similar ranges depending upon the thickness needed to meet waterproofing tests, which tests are readily performed by the skilled artisan, cost and weight constraints, i.e. seeking to minimize these parameters.

Another aspect of the disclosure (Aspect 16) is provided which is comprised of, consists essentially of, or consists of a printed circuit board comprising an adherent passivating polymeric coating applied to surfaces of the printed circuit board and electrically conductive traces affixed thereto, the polymeric coating comprising: a cured binder matrix comprised one or more of an organic or inorganic film-forming polymer, optionally cross-linked; reaction products of one or more polymer pre-cursors; reaction products of the film-forming polymer with one or more polymer precursors; a passivating agent comprising a thio-functional group, preferably a thiol group; an azolic moiety; an azole, and combinations thereof; and/or reaction products of the passivating agent with the electrically conductive traces and/or at least a portion of component a); and optionally particles of wax, insoluble in the cured binder matrix and dispersed therein. In a related aspect (Aspect 17), is the substrate of Aspect 16 wherein the adherent polymeric coating comprises a polymer made olefinic monomer comprising at least one of (meth)acrylate monomer(s), a vinyl monomer(s), styrene(s), acrylonitrile(s), and mixtures thereof.

Another aspect of the disclosure (Aspect 18) which is comprised of, consists essentially of, or consists of a passivating polymeric film deposited on a substrate surface according to the method of Aspect 12, wherein the substrate surface is a tape, backing or other support thereby forming a removable film for later transfer to an end use article, e.g. as a pre-formed film applied as a tape or via lamination to the end use article, such as a printed circuit board.

Another aspect of the disclosure (Aspect 19) which is comprised of, consists essentially of, or consists of polymeric water-resistant coatings of any of the foregoing Aspects can be prepared utilizing olefinic monomers which may be fully solubilized or at least partially solubilized in solvent and/or reactive diluent. In one embodiment, the present disclosure provides a coated substrate comprising at least one conductive metal trace on a non-conductive substrate, the metal trace and the non-conductive substrate having deposited thereon an adherent water-resistant polymer coating that is a reaction product of the above described coating composition the metal trace being passivated by the coating.

In one embodiment of the invention the coating is applied to conductive traces on printed circuit boards. In one embodiment the passivating agent, may comprise a molecule comprising a thiol functional group; an azolic moiety; or an azole, and combinations thereof. In one embodiment the binder component may comprise:

about 0.5-45 wt. % of a binder component selected from a polyester or a copolymer of olefin and vinyl ester, preferably a block copolymer, most preferably an ethylene vinyl acetate copolymer, based on the total weight of the composition, or about 20-98 wt. % a binder component comprising organic molecules having ethylenic unsaturation and optionally being UV-curable, based on the total weight of the composition.

In one embodiment the optionally additive(s) (C) may be present and comprise: about 2-80 wt. % of one or more additive(s), based on the total weight of the composition, selected from wax, adhesion promoter, flow modifier, wetting agent, rheology modifier, stabilizer, catalyst, photoinitiator, biocide, biostat and other additives useful in passivates or polymeric coatings.

The following terms as used in the present specification and claims have the meanings as defined herein. The term "ultra-thin" as used herein is based upon the IPC-CC-830 definition which is that an ultra-thin (UT) conformal coating is characterized by having a thickness which is 12.5 microns (0.49 mil) or less and may be organic, inorganic or a combination of organic and inorganic components. A "bath" is understood in the coating arts to mean a composition in a container into which an article to be treated may be immersed or partially immersed to contact the article or portions thereof with the composition in the container, e.g. a coating bath would be understood to mean a coating composition in a container generally used in a process for applying the coating composition. "Stage" as used herein refers to a period of time or a step in a process, e.g. a cleaning stage, a rinsing stage, a coating stage, which also may refer to the bath used to perform the step, e.g. a rinsing stage may refer to a rinse bath used in a rinsing step in a process. The term "solvent" means liquid that serves as the medium to at least partially dissolve a solute, e.g. component of a coating composition or concentrate according to the disclosure, and may include water, organic molecules, inorganic molecules and mixtures thereof, unless otherwise defined in the description. A "solvent system" or "solvent mixture" will be understood to comprise two or more solvents. The term "soluble" with respect to any component means that the component acts as a "solute" which dissolves in a solvent or solvent system or reaction mixture or coating composition thereby forming a solution, which does not form separate phases, whether liquid or solid, e.g. a precipitate, visible to the unaided human eye. The term "olefinic monomer" as used herein means a monomer having at least one carbon to carbon double bond (C═C) in its structure, this is also known as ethylenic unsaturation. Olefinic monomers may include (meth)acrylate monomers, vinyl monomers and other polymerizable monomers having a C═C structure. The term "(meth)acrylate monomer" as used herein includes acrylic acid, methacrylic acid, and esters thereof, which may be substituted or unsubstituted. A vinyl monomer as used herein includes monomers having a vinyl functional group, —CH═CH$_2$, in their structure. As used herein, "affixed to a substrate" means adhered, deposited, laminated, printed, etched, pressed, embossed or otherwise attached to the substrate. "Passivating" and its grammatical variations will be understood by those of skill in the art to mean a reduction in chemical reactivity of a surface, e.g. a metal surface, by a chemical reaction, coordination complexing or otherwise isolating of the metal surface by contacting it with one or more compositions thereby forming a more passive surface with less tendency to corrode. Within this disclosure, "water-resistant coating" is defined as a coating layer adhered to a surface and forming a barrier that resists corrosive damage to the board associated with immersion in water or other aqueous electrolytes while under power. Water-resistant coating layers may desirably resist and/or prevent permeation of oxygen and/or water-containing fluids to the coated surface. Certain water-resistant coatings disclosed herein also passivate some or all of the metal surfaces on printed circuit boards, in particular the traces. One gauge of water-resistant coating performance is prevention or reduction of damage to an assembled printed circuit board from exposure to water or aqueous liquids as a result of immersion, condensation or humidity while powered on, meaning while a voltage is being applied to the printed circuit board. Damage associated with such exposures of inadequately protected circuit boards include electrochemical migration phenomenon, such as dendritic growth and conductive anodic filament formation, as well as corrosive degradation of the conductive traces and conductive connections to electronic components.

For a variety of reasons, it is preferred that coating compositions and concentrates disclosed herein may be substantially free from many ingredients used in compositions for similar purposes in the prior art. Specifically, it is increasingly preferred in the order given, independently for each preferably minimized ingredient listed below, that at least some embodiments of coating compositions or concentrates according to the invention contain no more than 1.0, 0.5, 0.35, 0.10, 0.08, 0.04, 0.02, 0.01, 0.001, or 0.0002 percent, more preferably said numerical values in grams per liter, more preferably in ppm, of each of the following constituents: copper, gold, silver, oxidizing agents such as peroxides and peroxyacids, permanganate, perchlorate, chlorate, chlorite, hypochlorite, perborate, hexavalent chromium, sulfuric acid and sulfate, nitric acid and nitrate ions; as well as fluorine, formaldehyde, formamide, hydroxylamines, cyanides, cyanates; rare earth metals; boron, e.g. borax, borate; strontium; and/or free halogen ions, e.g., fluoride, chloride, bromide or iodide. Also, it is increasingly preferred in the order given, independently for each preferably minimized ingredient listed below, that at least some embodiments of as-deposited coatings according to the invention, contain no more than 1.0, 0.5, 0.35, 0.10, 0.08, 0.04, 0.02, 0.01, 0.001, or 0.0002 percent, more preferably said numerical values in parts per thousand (ppt), of each of the aforestated constituents and additionally unreacted monomer or solvent.

The simple term "metal" or "metallic' will be understood by those of skill in the art to mean a material, whether it be an article or a surface, that is made up of atoms of metal elements, e.g. aluminum, the metal elements present in amounts of at least, with increasing preference in the order given, 55, 65, 75, 85, or 95 atomic percent, for example the simple term "aluminum" includes pure aluminum and those of its alloys that contain at least, with increasing preference in the order given, 55, 65, 75, 85, or 95 atomic percent of aluminum atoms. A bare metallic surface will be understood to mean a metallic surface in the absence of a coating layer, other than oxides of metals derived from the metallic surface through aging in air and/or water.

Other than in the operating examples, or where otherwise indicated, all numbers expressing quantities of ingredients, reaction conditions, or defining ingredient parameters used herein are to be understood as modified in all instances by the term "about". Throughout the description, unless expressly stated to the contrary: percent, "parts of", and ratio values are by weight or mass; the description of a group or class of materials as suitable or preferred for a given purpose in connection with the invention implies that mixtures of any two or more of the members of the group or class are equally suitable or preferred; description of constituents in chemical terms refers to the constituents at the time of addition to any combination specified in the description or of generation in situ within the composition by chemical reaction(s) between one or more newly added constituents and one or more constituents already present in the composition when the other constituents are added; specification of constituents in ionic form additionally implies the presence of sufficient counterions to produce electrical neutrality for the composition as a whole and for any substance added to the composition; any counterions thus implicitly specified preferably are selected from among other constituents explicitly specified in ionic form, to the extent possible; otherwise, such counterions may be freely selected, except for avoiding counterions that act adversely to an object of the invention; molecular weight (MW) is weight average molecular weight unless otherwise specified; the word "mole" means "gram mole", and the word itself and all of its grammatical variations may be used for any chemical species defined by all of the types and numbers of atoms present in it, irrespective of whether the species is ionic, neutral, unstable, hypothetical or in fact a stable neutral substance with well-defined molecules.

This section provides a general summary of the disclosure and is not a comprehensive disclosure of its full scope or all features, aspects or objectives. These and other features and advantages of this disclosure will become more apparent to those skilled in the art from the detailed description of a preferred embodiment. The drawings that accompany the detailed description are described below.

DETAILED DESCRIPTION OF A PREFERRED EMBODIMENT

Figure 1:
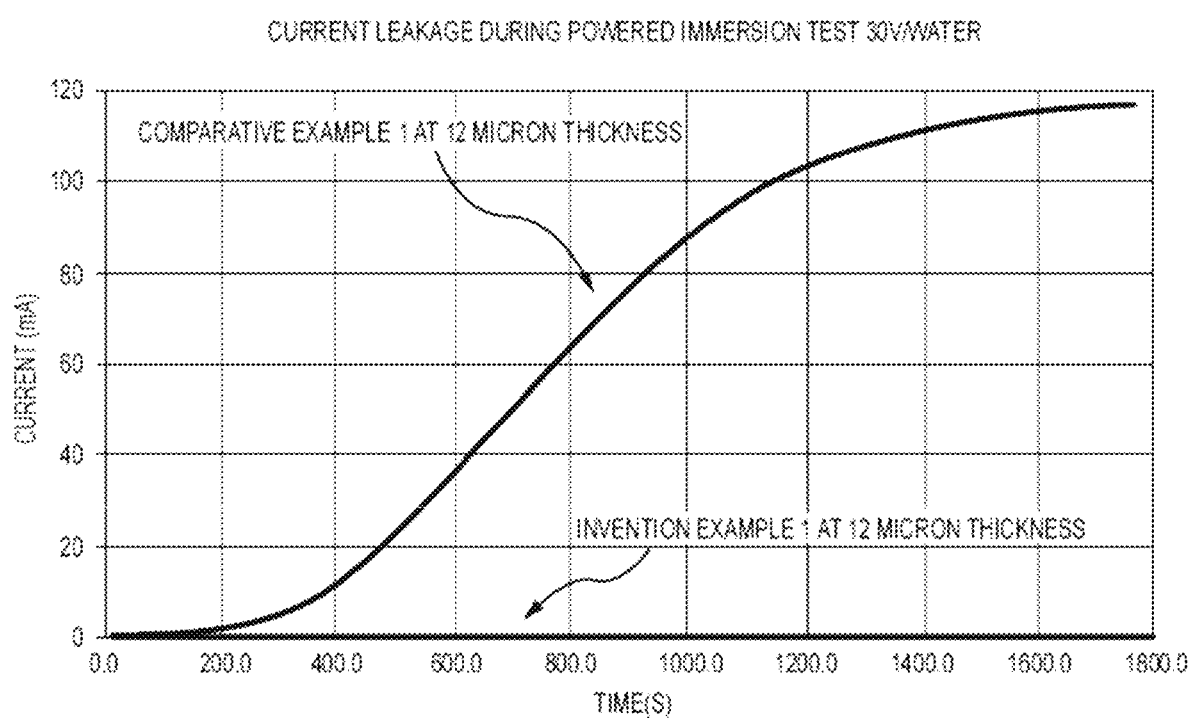
FIG. 1 is a graph showing the results of current leakage testing run on printed circuit boards coated according to the invention and printed circuit boards coated with a comparative commercially available coating.

The present disclosure provides a circuit board coating composition, preferably a liquid, comprising:
(A.) at least one passivating agent, preferably containing a molecule comprising a thio-functional group, preferably a thiol group; an azolic moiety; or an azole, and combinations thereof;
(B.) a binder component, which may comprise one or more of the following types of binders:
  1) an organic or inorganic film-forming material, e.g. a polymer, which is unreactive with (A);
  2) an organic or inorganic film-forming material, e.g. a polymer, which is capable of reacting with (A);
  3) one or more polymer pre-cursors, e.g. monomers, oligomers and/or pre-polymers, polymerizable on a substrate surface and unreactive to (A);
  4) one or more polymer pre-cursors, e.g. monomers, oligomers and/or pre-polymers, polymerizable on a substrate surface and capable of reacting with (A); and
(C.) optionally, one or more additive(s), such as wax, adhesion promoter, flow modifier, rheology modifier, stabilizer, catalyst, photoinitiator, biocide, biostat.

The at least one passivating agent (A) comprises one or more compositions capable of reacting with, coordinating with or otherwise altering at least one metal present in an electrical component thereby generating a less reactive surface for metal components of a printed circuit board such that surfaces of the metal components exhibit less corrosion, in particular when contacted with water, saline and the like. Desirably the at least one passivating agent (A) contains a molecule comprising at least one of a thio-functional group, preferably a thiol, an azolic moiety or an azole, and combinations thereof. Preferred passivating agents include thiol functional compounds and azolic moiety-containing compounds.

Thio-functional groups may be thioesters, thioethers, thiols and derivatives thereof such as thiolates and disulfides, e.g. thiolsulfinates, thiolsulfonates and sulfonic acids, and other organic molecules comprising a mercapto group capable of reacting with, coordinating with or otherwise altering at least one metal used as a trace or electrical part on a printed circuit board and suitable for incorporation into a polymeric coating according to the disclosure.

In one embodiment, the thio functional material is a thioether. The thioether may be monofunctional or polyfunctional. Desirably, the number of thioether functional groups per molecule is at least 1 and can be up to 10, optionally thioether functional groups of greater than 10 per molecule may be used provided that the additional functionality does not interfere with objects of the invention. The thioethers may also include other functional groups. Nonlimiting examples include dimethylsulfide, methionine, 2,2-thiodiacetic acid, 3,3-thiodipropionic acid, thioanisole, and S-acetylmercaptosuccinic anhydride. The thioether may also be part of a ring or aromatic system. Nonlimiting examples include thiophene, 2-thiophenecarboxylic acid, tetrathiafulvalene, 2-thiophenecarboxaldehyde, 3-thiophenecarboxaldeyde, thiazolidine, 4-thiazolidinecarboxylic acid, xylazine, and phenothiazine.

Thiol functional compounds suitable for use as the at least one passivating agent (A) may have a single thiol functional group or a plurality of thiol functional groups. Desirably, the number of thiol functional groups per molecule is at least 1 and can be up to 10, optionally thiol functional groups of greater than 10 per molecule may be used provided that the additional functionality does not interfere with objects of the invention. Nonlimiting examples of useful types of thiol functional compounds include alkylene glycol mercaptans, alkyl mercaptans and esters of mercaptocarboxylic acids.

Alkylene glycol dimercaptans may desirably correspond to general Formula I:

$$HS-[-(CH_2)_aO-]_b-(CH_2)_cSH \qquad \text{Formula I}$$

where "a" and "c" are independently 2 to 4; and "b" is 1 to 6.

Desirably the alkylene glycol dimercaptans may be ethylene glycol dimercaptans, propylene glycol dimercaptans, ethylene/propylene glycol dimercaptans and mixtures thereof.

Generally, esters of mercaptocarboxylic acids, may desirably be based on a C1 to C22 mercaptocarboxylic acids, desirably C1 to C18, more desirably C2 to C12. Preferred esters of mercaptocarboxylic acids comprise esters of mercaptopropionic acid with a polyfunctional alcohol, esters of mercaptoacetic acid with a polyfunctional alcohol and combinations thereof. Desirably the polyfunctional alcohols may include alkyl and aryl alcohols having more than one OH functional group. Suitable alcohols include alkylene glycols and polyalkylene glycols, for example diethylene glycol, dipropylene glycol, glycerol, trimethylolpropane, pentaerythritol, and dipentaerythritol.

Nonlimiting examples of thiol functional compounds useful in the invention include 2,2'-Oxydi-1-ethanethiol; 1,8-dimercapto-3,6-dioxaoctane; tetra(ethylene glycol)dithiol; ethylene glycol dimercaptoacetate (GDMA), ethylene glycol dimercaptopropionate (GDMP), trimethylolpropane mercaptopriopionate (TMPMP), pentaerythritol tetrakis 3-mercaptopropionate (PETMP), pentaerythritol tetrakis 2-mercaptoacetate (PETMA), dipentaerythritol tetrakis 3-mercaptopropionate (DiPETMP), dipentaerythritol tetrakis 2-mercaptoacetate (DiPETMA), dipentaerythritol hexakis 3-mercaptopropionate, dipentaerythritol hexakis 3-mercaptoacetate, as well as trimercapto functional compounds based on ethoxylated trimethylolpropane such as ethoxylated trimethylolpropane tri-3-mercaptopropionate, desirably the degree of ethoxylation may range from 5 to 12 moles of ethoxylation per thiol group, one such product is commercially available as Thiocure® ETTMP 1300. Other examples of thiol functional compounds include thiol functionalized silane oligomers, including alkoxy silane oligomers having one or more thiol functional groups, e.g. mercapto ethoxy silane oligomers such as Coatosil® T-Cure; thiol functionalized polycaprolactones, e.g. polycaprolactone Tetra(3-mercaptopropionate), such as Thiocure® PCL4MP 1350, and thioesters of tris-hydroxyethylisocyanurate such as Thiocure® Tempic.

In other embodiments, thiol functional compounds may possess secondary functional groups including but not limited to ethylenic unsaturation, azolic groups, silanol groups or hydroxyl groups.

Suitable thiol functional compounds also comprising one or more silicon atoms include mercaptoalkoxysilanes of the general Formula II:

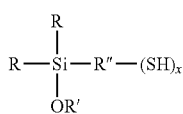

Formula II wherein:
the substituents R are identical or different and are: a C1-C8 alkyl (preferably CH₃); an alkenyl (preferably a C2-C12 alkenyl); an aryl (preferably a C6-C10 aryl); an aralkyl (preferably a C7-C16 aralkyl); or a group OR';
the substituents R' are identical or different and are: a C1-C24 (preferably C1-C4 or C12-C18) branched or unbranched monovalent alkyl or alkenyl group; an aryl group (preferably a C6-C10 aryl group), or an aralkyl group (preferably a C7-C16 aralkyl group);
R" is a branched or unbranched, saturated or unsaturated, aliphatic, aromatic or mixed aliphatic/aromatic divalent C1-C30 hydrocarbon group which is optionally substituted by NH₂ or NHR'; and
x is 1-3.

When x=1, R" is preferably —CH₂—, —CH₂CH₂—, —CH₂CH₂CH₂—, —CH₂CH₂CH₂CH₂—, —CH(CH₃)—, —CH₂CH(CH₃)—, —CH(CH₃)CH₂—, —C(CH₃)₂—, —CH(C₂H₅)—, —CH₂CH₂CH(CH₃)—, —CH₂CH(CH₃)CH₂—, or

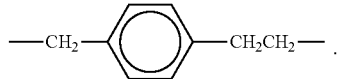

When x=2, R" is preferably CH, —CH—CH₂, —CH₂—CH, C—CH₃, —CH—CH₂—CH₂, —CH—CH—CH₃, or —CH₂—CH—CH₂.

Preferred (mercapto)alkoxysilanes of Formula II include: 3-mercaptopropyl(trimethoxysilane); 3-mercaptopropyl(triethoxysilane); 3-mercaptopropyl(diethoxymethoxysilane); 3-mercaptopropyl(tripropoxysilane); 3-mercaptopropyl(dipropoxymethoxysilane); 3-mercaptopropyl(tridodecanoxysilane); 3-mercaptopropyl(tritetradecanoxysilane); 3-mercaptopropyl(trihexadecanoxysilane); 3-mercaptopropyl(trioctadecanoxysilane); 3-mercaptopropyl(didodecanoxy)tetradecanoxysilane; 3-mercaptopropyl(dodecanoxy)tetradecanoxy(hexadecanoxy)silane; 3-mercaptopropyl(dimethoxymethylsilane); 3-mercaptopropyl(methoxydimethylsilane); 3-mercaptopropyl(diethoxymethylsilane); 3-mercaptopropyl(ethoxydimethylsilane); 3-mercaptopropyl(dipropoxymethylsilane); 3-mercaptopropyl(propoxydimethylsilane); 3-mercaptopropyl(diisopropoxymethylsilane); 3-mercaptopropyl(isopropoxydimethylsilane); 3-mercaptopropyl(dibutoxymethylsilane); 3-mercaptopropyl(butoxydimethylsilane); 3-mercaptopropyl(diisobutoxymethylsilane); 3-mercaptopropyl(isobutoxydimethylsilane); 3-mercaptopropyl(didodecanoxymethylsilane); 3-mercaptopropyl(dodecanoxydimethylsilane); 3-mercaptopropyl(ditetradecanoxymethylsilane); 3-mercaptopropyl(tetradecanoxydimethylsilane); 2-mercaptoethyl(trimethoxysilane); 2-mercaptoethyl(triethoxysilane); 2-mercaptoethyl(diethoxymethoxysilane); 2-mercaptoethyl(tripropoxysilane); 2-mercaptoethyl(dipropoxymethoxysilane); 2-mercaptoethyl(tridodecanoxysilane); 2-mercaptoethyl(tritetradecanoxysilane); 2-mercaptoethyl(trihexadecanoxysilane); 2-mercaptoethyl(trioctadecanoxysilane); 2-mercaptoethyl(didodecanoxy)tetradecanoxysilane; 2-mercaptoethyl(dodecanoxy)tetradecanoxy(hexadecanoxy)silane; 2-mercaptoethyl(dimethoxymethylsilane); 2-mercaptoethyl(methoxydimethylsilane); 2-mercaptoethyl(diethoxymethylsilane); 1-mercaptoethyl(ethoxydimethylsilane); 1-mercaptomethyl(trimethoxysilane); 1-mercaptomethyl(triethoxysilane); 1-mercaptomethyl(diethoxymethoxysilane); 1-mercaptomethyl(dipropoxymethoxysilane); 1-mercaptomethyl(tripropoxysilane); 1-mercaptomethyl(trimethoxysilane); 1-mercaptomethyl(dimethoxymethylsilane); 1-mercaptomethyl(methoxydimethylsilane); 1-mercaptomethyl(diethoxymethylsilane); 1-mercaptomethyl(ethoxydimethylsilane); 1,3-dimercaptopropyl(trimethoxysilane); 1,3-dimercaptopropyl(triethoxysilane); 1,3-dimercaptopropyl(tripropoxysilane); 1,3-dimercaptopropyl(tridodecanoxysilane); 1,3-dimercaptopropyl(tritetradecanoxysilane); 1,3-dimercaptopropyl(trihexade canoxysilane); 2,3-dimercaptopropyl(trimethoxysilane); 2,3-dimercaptopropyl(triethoxysilane); 2,3-dimercaptopropyl(tripropoxysilane); 2,3-dimercaptopropyl(tridodecanoxysilane); 2,3-dimercaptopropyl(tritetradecanoxysilane); 2,3-dimercaptopropyl(trihexadecanoxysilane); 3-mercaptobutyl(trimethoxysilane);

3-mercaptobutyl(triethoxysilane); 3-mercaptobutyl(diethoxymethoxysilane); 3-mercaptobutyl(tripropoxysilane); 3-mercaptobutyl(dipropoxymethoxysilane); 3-mercaptobutyl(dimethoxymethylsilane); 3-mercaptobutyl(diethoxymethylsilane); 3-mercaptobutyl(dimethylmethoxysilane); 3-mercaptobutyl(dimethylethoxysilane); 3-mercaptobutyl(tridodecanoxysilane); 3-mercaptobutyl(tritetradecanoxysilane); 3-mercaptobutyl(trihexadecanoxysilane); 3-mercaptobutyl(didodecanoxy)tetradecanoxysilane; or 3-mercaptobutyl(dodecanoxy)tetradecanoxy(hexadecanoxy)silane. These compounds and others of Formula I may be used individually or mixtures of the compounds may be employed.

Representative nonlimiting examples preferred for use in coating compositions include passivating agents having a second functional group in/on the molecule:

thiol functionalized polyacrylate oligomers and pre-polymers having reactive unsaturation, such as thiol functionalized urethane acrylates, polyester acrylates, amino acrylates and epoxy acrylates. Preferred examples include Ebecryl Ultraviolet (UV) and electron beam (EB) energy-curable pre-polymers, e.g. a mercapto modified, polyester acrylate resin;

mercaptobenzotriazole, which has a thiol functional group on a triazole ring, which ring is fused with a benzene;

thiol functional silanes as described above, in particular 3-mercaptopropyltrimethoxysilane; and thiols bearing silanol precursors which upon hydrolysis yield thiol functional silanes, such as by way of non-limiting example Dow Corning Z-6062, Momentive A-189, Evonik MTMO, HENGDA-M2133, SHinEtsu KBM-803, Wacker GF70, and Coatosil Tcure, a silane oligomer of approximately 600-700 g/mol;

thio-functional silanes for example 2-(3-trimethoxysilylpropylthio)thiophene;

thiols having a polar functional group in the molecule, such as an ether moiety, a hydroxyl functional group or an acid functional group. Nonlimiting examples include dithiothreitol, poly(ethylene glycol) methyl ether thiol, poly(ethylene glycol) 2-mercaptoethyl ether acetic acid and azolic moiety bearing silanes such as N-(3-triethoxysilylpropyl)-4,5-dihydroimidazole.

Other preferred materials for use as the at least one passivating agent (A) are compounds having an azolic moiety or azole compounds. Azole functional compounds suitable for use as the at least one passivating agent (A) may have a single azolic moiety or a plurality of azolic moieties, that is a single azole ring or a plurality of azole rings. Desirably, the number of azolic moieties per molecule is at least 1 and can be up to 10, optionally azolic moieties of greater than 10 per molecule may be used provided that the additional functionality does not interfere with objects of the invention. Nonlimiting examples of useful types of azole ring functional compounds include triazoles, imidazoles, triazines, tetrazoles and oxazole, alone or thiol modified.

Non-limiting examples include substituted and unsubstituted benzotriazole, tolyltriazole, mercaptobenzotriazole, including alkyl-substituted benzothiazoles, such as methylbenzotriazole.

The triazole chemistries, such as tolyltriazole (TTA), benzotriazole (BZT) and mercaptobenzotriazole (MBT), are preferred as the at least one passivating agent (A) for copper-containing traces. Triazole compounds are believed to passivate copper by forming a protective cuprous oxide ($Cu_2O$) film at the metal's surface.

Suitable thiol modified azoles, include 2-mercaptobenzoxazole; benzothiazole, mercaptobenzotriazole; mercaptobenzothiazole; 2,5-dimercapto-1,3,4-thiadiazole; 2-amino-5-ethylthio-1,3,4-thiadiazole (AETD); 2-amino-5-ethyl-1,3,4-thiadiazole; 5-(phenyl)-4H-1,2,4-triazole-3-thiole; 5-mercapto-1-methyl-tetrazole; 5-mercapto (Na salt)-1-methyl-tetrazole; 5-mercapto-1-acetic acid (Na salt)-tetrazole; 5-mercapto-1-phenyl-tetrazole (5Mc-1Ph-T); 5-phenyl-tetrazole (5Ph-T); 5-phenyl-tetrazole; 5-mercapto-1-phenyl-tetrazole (5Mc-1Ph-T); 5-aminotetrazole (5NH2-T); 5-(4'-dimetylaminobenzylidene)-2,4-dioxotetrahydro-1,3-thiazole; 2-mercaptobenzothiazole; 2-(octadecylthio)benzothiazole and combinations thereof.

Other suitable azoles include:

1,2,4-triazole and derivatives: 3-amino-1,2,4-triazole; 4-amino-1,2,4-triazole; 4-amino-4H-1,2,4-triazole-3thiol; 4-amino-5-methyl-4H-1,2,4-triazole-3thiol; 4-amino-5-ethyl-4H-1,2,4-triazole-3thiol; 4-amino-3-hydrazino-5-mercapto-1,2,4-triazole; bis-(4-amino-5-mercapto-1,2,4-triazol-3-yl)-butane;

imidazole and derivatives: 2-mercapto-1-methylimidazole; 4-methyl-1-(p-tolyl)-imidazole; 4-methyl-1-phenyl imidazole; 4-methyl-1-(o-tolyl)-imidazole; benzimidazole; 2-mercaptobenzimidazole; 2-thiobenzylbenzimidazole; 2-thiomethylbenzimidazole; 5-methoxy-2-(octadecylthio)benzimidazole;

thiadiazole; and derivatives: 2,5-dimercapto-1,3,4-thiadiazole; 5-phenyl-1,3,4-thiadiazole-2-thiol; 2-(5-mercapto-1, 3,4-thiadiazole-2-yl)-phenol; 5-mercapto-3-phenyl-1,3,4-thiadiazole-2-thione potassium; 5-phenyl-2-amino-1,3,4-thiadiazole, 5-(4-methoxyphenyl)-2-amino-1,3,4-thiadiazole, 5-(4-nitrophenyl)-2-amino-1,3,4-thiadiazole; 5-methyl-[1,3,4]thiadiazol-2-ylsulfanyl)-acetic acid; (4-dimethylamino-benzylidene)-hydrazid; 2-amino-5-(4-pyridinyl)-1,3,4-thiadiazole; 1,2-dihydro-3-(octadecylthio)benzotriazine; 2,4,6-trimercapto-1,3,5-triazine (TMTA).

Benzotriazole derivatives are also suitable for example N-[benzotriazol-1-yl-(phenyl)-methylene]-N-phenyl-hydrazine; N-[benzotriazol-1-yl-(4-methoxy-phenyl)-methylene]-N-phenyl-hydrazine; N-(2-thiazolyl)-1H-benzotriazole-1-carbothioamide; N-(furan-2-ylmethyl)-1H-benzotriazole-1-carbothioamide; N-benzyl-1H-benzotriazole-1-carbothioamide; 1-(2-thienyl carbonyl)-benzotriazole and 1-(2-pyrrole carbonyl)-benzotriazole. The derivatives of benzotriazole, namely 5-pentyl-BTA; 5-chloro-BTA, N-[benzotriazol-1-yl-(phenyl)-methylene]-N-phenyl-hydrazine; N-[benzotriazol-1-yl-(4-methoxy-phenyl)-methylene]-N-phenyl-hydrazine, N-(2-thiazolyl)-1H-benzotriazole-1-carbothioamide, N-(furan-2-ylmethyl)-1H-benzotriazole-1-carbothioamide; N-benzyl-1H-benzotriazole-1-carbothioamide, 1-(2-thienyl carbonyl)-benzotriazole; 1-(2-pyrrole carbonyl)-benzotriazole are also desirable for use as the at least one passivating agent (A).

In a preferred embodiment the coating provides a water-proofing function, meaning increasing water-resistance, to coated circuit boards in electronic devices such as handheld phones. The passivating agent may be a solid or a liquid. In some embodiments, the passivating agent is preferably a liquid at ambient temperature, generally about 2° C. to 100° C., preferably 10° C. to 32° C. In some embodiments, the passivating agent may be chemically reactive with the film forming polymer of the coating composition. Alternatively, in other embodiments the passivating agent is non-reactive with the film forming polymer of the coating composition such that the passivating agent is dispersed in the polymer matrix of the coating and may advantageously be mobile within the applied and dried coating. Mobility of the passivating agent enables interaction with traces that have become damaged, e.g. providing a self-healing repassivation of the metal after e.g. onset of corrosion or physical damage from generating a new component connection.

Binder component (B) may comprise one or more of the following types of binders:
B1) An organic or inorganic film-forming polymer that is unreactive with (A);
B2) An organic or inorganic film-forming polymer, which is capable of reacting with (A);
B3) One or more polymer pre-cursors, e.g. monomers, oligomers and/or pre-polymers, polymerizable on a substrate surface and unreactive with (A);
B4) One or more polymer pre-cursors, e.g. monomers, oligomers and/or pre-polymers, polymerizable on a substrate surface and capable of reacting with (A).

In some embodiments, the coating composition is deposited on an end-use article, e.g. the electronic component to be coated, alternatively the coating composition may form a removable film on a tape, removable backing or form and the like, for later transfer to an end use article, e.g. as a pre-formed film.

First Binder Type:

Binder component (B) of the coating composition may comprise an organic or inorganic film-forming polymer that is unreactive with the passivating agent. Film-forming polymers produce a physical, continuous and flexible film upon dry-down and may be thermoplastic or thermosetting. In some embodiments, these film-forming polymers may have elongation values >100%.

Suitable examples of film-forming polymers include polyesters; polyurethanes; polyolefins; olefinic copolymers; (meth)acrylate copolymers and combinations thereof which are unreactive with the passivating agent in the coating composition.

In preferred embodiments, suitable types of olefinic copolymers, i.e. made from olefinic monomers, may be ethylene-vinyl acetate copolymers (so-called EVA resins). Desirably, weight ratios of ethylene to vinyl acetate monomer comprising the EVA copolymer may be in a range of from 95:5 to 50:50, with preferred ethylene to vinyl acetate monomer ratios in a range between 60:40 and 80:20. This ratio may desirably be selected to compatibilize the EVA copolymer with other components of the coating composition thereby controlling solubility of the EVA copolymer within the formulated coating. The ethylene to vinyl acetate monomer ratio may also be selected such that upon drying and/or curing of the coating composition, composite coatings form wherein passivating agent is present as a dispersed secondary phase within a polymeric matrix of the dried coating.

Suitable types of (meth)acrylate copolymers for use as the film-forming polymer that is unreactive with the passivating agent, may be reaction products of (meth)acrylate monomers and other ethylenically unsaturated optional co-monomers. Ethylenically unsaturated monomers and co-monomers may be co-polymerized to form the (meth)acrylate copolymers by polymerization processes widely known in the art. The resulting co-polymer may comprise reaction products of a variety of monomers, for example, methacrylic acid monomer, methacrylate ester monomers, acrylic acid monomer, acrylate ester monomers, styrene monomers, alpha-methylstyrene monomers, acrylonitrile monomers, methacrylonitrile monomers, hydroxyl functional methacrylate ester monomers such as hydroxyethyl (meth)acrylate, hydroxypropyl (meth)acrylate, hydroxybutyl (meth)acrylate, and isobornyl (meth)acrylate. Particularly preferred (meth)acrylate esters include C1-C22 linear and branched alkyl esters. Preferred (meth)acrylate copolymers may be prepared from the above-described monomers, polymerized in the presence of a radical generator via free radical reactions comprising alkyl esters of acrylic and methacrylic acid. Generally speaking (meth)acrylate monomers with alkyl chain length of 2-18 carbons are preferred, with alkyl chain length of 4-8 carbons being particularly preferred.

Other film-forming polymer that is unreactive with the passivating agent include polyesters, which are commonly reaction products of carboxylic acids and alcoholic precursors; and polyurethanes, which are commonly prepared from polyisocyanates and alcoholic precursors. Non-limiting representative examples of polyesters include homopolymers and copolymers of epsilon-caprolactone. Non-limiting representative examples of polyurethanes include reaction products of aliphatic polyisocyanate with hydroxide functional reactants, such as polyether alcohols and aliphatic alcohols which desirably have 2 or more moles of hydroxyl per molecule. Particularly preferred polyisocyanates include those based on hexamethylene diisocyanate. Generally, aliphatic precursors without ring structures are preferred where hydrophobic and flexible polymers are desired.

Second Binder Type:

Binder component (B) of the coating composition may comprise an organic or inorganic film-forming polymer, which is capable of reacting with the passivating agent. In some embodiments it may be advantageous for the binder utilized (thermosetting or thermoplastic) to possess functional groups which are reactive with the passivating agent. One preferred type of functional groups is those reactive with thiols. Nonlimiting examples of thiol reactive functional groups include epoxy, isocyanate, carboxylic acid, and -ene (C=C) linkages.

Similar to the first binder type, the backbone of the film-forming polymer can be polyesters; polyurethanes; polyolefins; olefinic copolymers; (meth)acrylate copolymers and combinations thereof, but functional moieties different from the first binder type, make the second binder type capable of reacting with the passivating agent in the coating composition. Nonlimiting examples of binders possessing one or more of these groups reactive with the passivating agent include isocyanate terminated polyurethanes; polyesters and (meth)acrylate copolymers comprising ester linkages, carboxyl terminated polyesters, ethylene acrylic acid copolymers, polyolefins containing unsaturation, e.g. polybutadienes, and copolymers of polybutadiene, such as copolymers of acrylonitrile and butadiene.

Third Binder Type:

Polymer pre-cursors, building blocks for generating polymers thereby forming a coating on a substrate, are useful as binders in the invention. Accordingly, binder component (B) of the coating composition may comprise one or more polymer pre-cursors, e.g. monomers, oligomers and/or pre-polymers, polymerizable on a substrate surface and unreactive to the passivating agent. In some embodiments it is preferable to conduct substantial polymerization to form a cured coating after application of a coating composition onto a substrate, i.e. a PCB. Some polymerization after application of the coating composition to the substrate may occur prior to a curing step, e.g. UV or thermal energy exposure. UV cure of the one or more polymer pre-cursors, e.g. monomers, oligomers and/or pre-polymers, is preferred. Any curing mechanism compatible with the components of the coating composition and generating a solid adherent coating after cure can be used.

UV curing coatings are widely known in the art and may comprise (meth)acrylate monomers, i.e. acrylate and methacrylate monomers, and like oligomers with functionality ranging from 1 to 10 or more ethylenic unsaturations per molecule. UV curing materials offer many advantages as widely known in the art such as they can be rapidly cured and applied in the absence of solvent.

UV curable film forming polymer precursors may comprise mixtures of monomers, oligomers, and/or polymer precursors bearing ethylenic unsaturation and a photoinitiator. Binder polymer precursors may possess 1 or more ethylenically unsaturated groups. Examples of suitable (meth)acrylate monomers, i.e. acrylate and methacrylate monomers having a polymerizable double bond that can be used to form both UV curable and thermosetting polymeric binders include but are not limited to: alkyl acrylates; alkyl methacrylates; hydroxyalkyl acrylates; hydroxyalkyl methacrylates; substituted alkyl acrylates or alkyl methacrylates like 2 ethylhexyl acrylate or 2 ethylhexyl methacrylate; and other acrylates and methacrylates such as isobornyl acrylate; and mixtures thereof.

Other suitable examples of (meth)acrylate monomers, i.e. acrylate and methacrylate monomers, which have more than one double bond include, but are not limited to polyacrylate and polymethacrylate functional monomers such as: ethylene glycol diacrylate; propylene glycol diacrylate; diethylene glycol diacrylate; dipropylene glycol diacrylate; triethylene glycol diacrylate; tripropylene glycol diacrylate; tertraethylene glycol diacrylate; tetrapropylene glycol diacrylate; polyethylene glycol diacrylate; polypropylene glycol diacrylate; ethoxylated bisphenol A diacrylate; bisphenol A diglycidyl ether diacrylate; resorcinol diglycidyl ether diacrylate; 1,3-propanediol diacrylate; 1,4-butanediol diacrylate; 1,5-pentanediol diacrylate; 1,6-hexanediol diacrylate; neopentyl glycol diacrylate; cyclohexane dimethanol diacrylate; ethoxylated neopentyl glycol diacrylate; propoxylated neopentyl glycol diacrylate; ethoxylated cyclohexanedimethanol diacrylate; propoxylated cyclohexanedimethanol diacrylate; epoxy polyacrylates; aryl urethane polyacrylates; aliphatic urethane polyacrylates; polyester polyacrylates; trimethylol propane tri (meth)acrylate; glycerol tri (meth)acrylate; ethoxylated trimethylolpropane tri(meth)acrylate; propoxylated trimethylolpropane tri (meth)acrylate; trimethylolethane tri(meth)acrylate; tris (2-hydroxyethyl) isocyanurate triacrylate; ethoxylated glycerol tri(meth)acrylate; propoxylated glycerol tri(meth)acrylate; pentaerythritol tri(meth)acrylate; melamine triacrylates; epoxy novolac triacrylates; aliphatic epoxy triacrylates; and mixtures thereof. Preferred tetraacrylates that are also suitable alone or in combination with the above monomers include, but are not limited to: di-trimethylolpropane tetra(meth)acrylate; pentaerythritol tetra(meth)acrylate; ethoxylated pentaerythritol tetra(meth)acrylate; propoxylated pentaerythritol tetra(meth)acrylate; dipentaerythritol tetra(meth)acrylate; ethoxylated dipentaerythritol tetra(meth)acrylate; propoxylated dipentaerythritol tetra (meth)acrylate; divinylbenzene; divinyl succinate, diallyl phthalate; triallyl phosphate; triallyl isocyanurate; tris(2-acryloyl ethyl)isocyanurate; aryl urethane tetra(meth)acrylates; aliphatic urethane tetra(meth)acrylates; polyester tetra (meth)acrylates; melamine tetra(meth)acrylates; epoxy novolac tetra(meth)acrylates; and mixtures thereof. Higher functional acrylates that are also suitable include, but are not limited to: dipentaerythritol penta(meth)acrylate; dipentaerythritol hexa(meth)acrylate; tripentaerythritol octa(meth)acrylate; and mixtures thereof. These monomers can be used to form both a UV curable polymeric binder and a thermosetting polymeric binder.

The coating composition may be a one-pot material or if desired may be applied in two or more parts, which react together on the substrate to form a coating. Preferred embodiments include UV curable coating compositions wherein the passivating agent (A) utilized is substantially unreactive with other components of the UV curable coating composition prior to, during or after application and curing.

Fourth Binder Type:

Another type of binder useful in binder component (B) may be binders comprising one or more polymer pre-cursors, e.g. monomers, oligomers and/or pre-polymers, polymerizable on a substrate surface and capable of reacting with the passivating agent. In some embodiments, it is preferable to conduct substantial polymerization of the coating composition as well as react passivating agent with functional groups in the coating composition after application of the coating composition onto a substrate, e.g. a PCB. For example, monomers, oligomers and/or pre-polymers may also include functional groups reactive with a passivating agent. Non-limiting examples include of binders polymerizable by UV energy having functional groups present which are reactive to at least one of a thio-functional group, preferably a thiol functional groups, an azolic moiety or an azole. Typically, UV curable polymer pre-cursors have ethylenic unsaturation which may be directly reactive the thiol functional groups in the passivating agent. In a preferred embodiment, the passivating agent comprises a poly-thiol with which ethylenic unsaturation present in the one or more polymer pre-cursors, e.g. monomers, oligomers and/or pre-polymers of binder (B) is reactive. During curing of a UV curable coating which contains poly-thiols, bound thiol functional groups can be formed within the cured coating by reaction with the polymerizable monomers, oligomers and/or pre-polymers. Nonlimiting examples of thiol reactive functional groups that may be present on the polymer pre-cursors include epoxy, isocyanate, ene (C=C) linkages, and carboxylic acid.

In another embodiment, the passivating agent comprises a secondary functional group, different from and in addition to the thio-functional group; an azolic moiety; or azole. In this embodiment, the one or more polymer pre-cursors, e.g. monomers, oligomers and/or pre-polymers, polymerizable on a substrate surface are reactive with the secondary functional group. This occurs most often when utilizing UV curable polymer pre-cursors, as disclosed herein, which have ethylenic unsaturation reactive toward various secondary functional groups of the passivating agent. A nonlimiting example of passivating agent having a secondary functional group is vinyl imidazole, which possess an azole moiety and a secondary functional group in the form of a vinyl group. The UV curable polymer pre-cursors comprise ethylenic unsaturation reactive with the vinyl functional group of the passivating agent upon exposure to UV curing conditions. Other nonlimiting examples of secondary functional groups with which ethylenic unsaturation of the UV curable polymer pre-cursors of the binder may react include silane functional groups, hydroxyl functional groups and carboxyl functional groups. Nonlimiting examples of materials possessing both a thio- or thiol functional group or azolic moiety and a different secondary functional group include thio- and thiol functional silanes, azolic moiety bearing silanes, hydroxyl bearing thiol compounds, and carboxyl bearing thiols. Nonlimiting examples include 2-(3-trimethoxysilylpropylthio)thiophene, 3-mercaptopropyltrimethoxysilane, N-(3-triethoxysilylpropyl)-4,5-dihydroimidazole, 6-mercapto 1-hexanol, and mercaptopropionic acid respectively. UV curable coating compositions are widely known in the art are described elsewhere in the specification.

As disclosed herein, several types of binders may be used either alone or in combination. Combination of passivating agent and the binder provides metal passivation chemistry supporting performance at thinner coating layers. One aspect of the invention provides a flexible coating typically based on the first and optionally the second binder types. These polymer binders provide coating compositions free of all fluoro-based chemicals suitable for thermal drying/curing which provide low viscosity such that spray application processes may be used. A principal polymer binder having more than 1000% elongation at break (ASTM D1708 (19 mm dogbone @ 1.3 mm thickness) may be used. Coatings comprising first and second binder types may also be applied as peelable films. The resulting a flexible coating after drying/curing provides reduced current leakage and visible corrosion compared to a commercial benchmark. Another aspect of the invention provides a firmer, less flexible coating typically based on the third and fourth binder types. These polymer binders provide coating compositions free of all fluoro-based chemicals and may be provide solvent-free formulations. The resulting coating compositions are low viscosity such that spray application processes may be used and may be dual cured (e.g. ambient and UV or thermal). The resulting a firmer UV cured coating provides very low current leakage and visible corrosion even after 30 minutes submerged in saline electrolyte powered with a 20 V bias.

Desirably, the passivating agent and film forming binder are compatible and soluble in the solvent carrier and/or reactive diluent of the coating composition. In some embodiments, the passivating agent and film forming binder may be selected such that phase separation upon drying occurs whereby the passivating agent forms a secondary phase within the resulting composite coating. This secondary phase may be present as isolated globules or zones within the composite coating or may exhibit stratified layers in the coating comprising at least a first layer having greater concentration of passivating agent and a second layer having lesser concentration of the passivating agent. It was surprisingly found that selecting a weight ratio of passivating agent to film forming binder of about 100:1 to 1:100 and a solubility of the passivating agent in the binder or reaction product of the binder or matrix of the as deposited coating to meet the above-identified criterion enables selection of a coating morphology that remains two-phase and adherent upon drying.

In some embodiments, it may be desirable to select the concentration of passivating agent to be greater than the solubility limit of the passivating agent in the binder such that upon drying secondary phases of reservoirs of passivating agent are provided in the dried coating. Not wishing to be bound by theory, it is believed that such secondary phases can serve as reservoirs of passivating agent within the coating such that the passivating agent may be available to contact corrosive or physical damage on a printed circuit board, e.g. corresponding to corrosion initiation. This feature may enable the coating to prevent or reduce undesirable consequences of changes in the service environment. Examples of changes in the service environment include an electronic device, such as a cellphone, containing a coated PCB contacting or being immersed in water or aqueous solutions, particularly in the powered state. In the absence of coating features described in this embodiment, degradation pathways such as dendritic growth between the traces and corrosive damages to the traces will cause catastrophic damage to the device.

In some embodiments, the water-resistant coating is applied to all conductive surfaces of the printed circuit board including one or more connection surfaces. Electrical connection is established when the coated surfaces of the printed circuit board and connector are contacted with sufficient force to deform and or penetrate the coating. This process of intrusively establishing electrical connection can be considered a change in the service environment and the uniform presence of passivating agent both within the continuous phase of the coating matrix as well as stored within reservoirs or stratified layers within the coating, enable the coating to respond by passivating agent movement to areas of disturbed or damaged coating whereupon the passivation agent re-passivates the disturbed or damaged coating/conductor interface. The invention provides a coating composition and dried coating enabling PCB subunits to connect, disconnect, and reconnect repeatably while maintaining water-resistant performance.

The invention is useful in coating electronic components for example selected surfaces of circuit boards, in particular, printed circuit boards (PCBs). A printed circuit board is an electrically non-conductive material with electrically conductive traces, also referred to as "lines", "tracks" or "conductors", on the board. Electronic components, e.g. integrated circuits (ICs), resistors, capacitors, inductors and connectors, switches and relays, are mounted on the board and traces connect the components to form a working circuit or assembly. The board can be either single sided (one signal layer on top of the board), double sided (two signal layers on top and bottom of the board), or multi-layered (greater than two layers) depending on the number of components and the interconnection density. Components are interconnected to one another by traces on the PCB surface and often embedded among the layers of the board. When inadequately protected, corrosion or breakage of the traces causes failures in electrical conductivity along the trace path and damages can occur associated with electrochemical migration phenomenon such as dendritic growth and conductive anodic filament formation.

Metals suitable for use as metal surfaces for traces comprise copper, iron, zinc, nickel, tin, lead, cobalt, titanium, molybdenum, ruthenium, palladium, rhodium and rhenium, mixtures thereof, alloys thereof and mixtures of alloys thereof. A preferred metal article for coating includes conductive metal traces affixed to a substrate according to the present disclosure, which may desirably comprise copper, zinc, iron, tin, lead and mixtures thereof, alloys thereof and mixtures of alloys thereof. Preferably the metal is copper or a copper alloy. The metal traces may comprise, consist essentially of or consist of copper, zinc, iron, mixtures thereof, alloys thereof and mixtures of alloys thereof.

Carbon may be present as a layer on metal surfaces of the PCB, augmenting or replacing some or all of the metal element. In one embodiment, a conductive carbon, such as graphene, graphite and the like, comprises at least a portion of a trace. In some embodiments, a conductive carbon-containing ink is used as a second layer on metal traces to replace gold plating of traces. The conductive carbon-containing inks as known in the art are typically carbon pigment, such as carbon black and/or other carbons as disclosed above, dispersed in a thermoset polymer medium. Examples of uses for carbon include: Crossover connector to allow less complex board manufacturing process; contacts that may need to be wear resistant (sliding contact); and as a low cost alternative to gold plating (often used in combination with copper). Coating compositions and processes according to this disclosure may also be applied to carbon-containing portions of a PCB providing similar benefits as those for metal traces.

In one embodiment the substrate is a circuit board having metal traces affixed thereto, preferably a printed circuit board, useful in electronics. Typically, the circuits on a printed circuit board are printed using copper traces, aluminum traces or other suitable electrically conductive metals.

Suitable solvents useful in the present disclosure are organic solvents, which may optionally contain water provided that it does not interfere with objects of the invention. Desirably solvent provides single phase solutions or readily dispersible mixtures of passivating agent and binder(s). Preferred types of solvents include ketones, aromatic hydrocarbons, aliphatic hydrocarbons, ethers, glycol ethers, glycol ether esters, esters, and alcohols. Nonlimiting representative examples of useful solvents include methyl ethyl ketone, methyl propyl ketone, methyl isobutyl ketone, methyl amyl ketone, toluene, xylene, pentane, hexane, heptane, mono-alkyl ethers of propylene glycol, dialkyl ethers of propylene glycol, mono-alkyl ethers of ethylene glycol, dialkyl ethers of ethylene glycol, mono-alkyl ether acetates of propylene glycol, mono-alkyl ether acetates of ethylene glycol, butanol, isopropanol, isobutanol, propyl acetate, butyl acetate, amyl acetate, isobutylisobuyrate, butylpropionate, pentylpropionate, and the like.

Coating compositions may be solvent free, if desired. As such the range of solvent amounts is quite broad overall, and tends to vary depending upon method of application, as well as other components of the coating composition. As a general matter, organic solvent may be absent or present in only ppm amounts for uses desiring to minimize organic solvent use or may comprise up to 95 wt. % of the coating composition, for example for dipping applications.

In a preferred embodiment, the coating composition is applied by spray to an electronic component or to a tape, support or backing for later application to an end-use substrate. Preferred concentrations of solvent within the coating composition varies with the binder and passivating agent used but generally varies between 40 and 90 weight % of the formulation. In another embodiment the coating is applied by dipping. Preferred ranges in this case can vary between 75% and 95% by weight. In another embodiment the coating composition is applied to a removable backing substrate and is applied to the circuit component as a laminated film or tape.

Amounts of non-solvent components are provided herein as concentrations of the relevant component in formulations excluding solvent, which may be added in a manner known to those of skill in the art:

Passivating Agent may be present in coating compositions of the invention in amounts of from about 0.5 wt. % to about 55 wt. % of a formulation, excluding solvent. Within this range, desirably amounts may be at least in increasing order of preference 1, 2, 3, 4, 5, 6, 7, 8, 9, 10, 11, 12, 13, 14, 15, 16 wt. % and at least for economy may be not more than in increasing order of preference 50, 47, 45, 43, 40, 38, 36, 34, 32, 30, 29, 28, 27, 26, 25, 24, 23, 22, 21, 20, 19, 18, 17 wt. %.

Binder (film forming polymer, polymer precursors, and combinations thereof) may be present in coating compositions of the invention in amounts of from about 25 wt. % to about 99 wt. % of a formulation, excluding solvent. Within this range, desirably amounts may be at least in increasing order of preference 30, 32, 34, 36, 38, 40, 42, 44, 46, 48, 50, 52, 54, 56, 58, 60, 61, 62, 63, 64, 65, 66 wt. % and at least for economy may be not more than in increasing order of preference 97, 95, 92, 90, 88, 85, 83, 80, 78, 76, 74, 72, 70, 68 wt. %.

Optional Additives may be absent from the coating compositions. Alternatively, the optional additives may be present in coating compositions of the invention in amounts of from about 0.01 wt. % to about 15 wt. % of a formulation, excluding solvent. Within this range, desirably amounts may be at least in increasing order of preference 0.02, 0.04, 0.05, 0.07, 0.09, 0.1, 0.2, 0.4, 0.5, 0.7, 0.9, 1.0, 1.2, 1.5, 1.7, 2.0, 2.2, 2.5, 2.7, 3.0, 3.2, 3.5, 3.7, 4.0, 4.2, 4.5, 4.7, 5.0, 5.2, 5.5, 5.7, 6.0, 6.2, 6.4, 6.5, 6.7, 6.9, 7.0 wt. % and at least for economy may be not more than in increasing order of preference 14, 13, 12, 11, 10, 9.75, 9.50, 9.25, 9.0, 8.7, 8.5, 8.3, 8.0, 7.7, 7.5, 7.2 wt. %.

As discussed above, solvent(s) may be absent from the coating compositions. Alternatively, solvent(s) may be present in coating compositions of the invention in total amounts of from about 0.01 wt. % to about 95 wt. %. Within this range, desirably amounts may be at least in increasing order of preference 0.1, 0.05, 1, 5, 10, 15, 20, 25, 30, 35, 40, 45, 50 wt. % and at least for economy may be not more than in increasing order of preference 92, 90, 85, 80, 75, 70, 68, 65, 63, 60, 58, 55, 53 wt. %.

For each of the above identified components, amounts greater than those preferred can be used within the scope of the invention provided that they do not interfere with the objects of the invention, such as by causing coating composition instability or the like.

Suitable olefinic monomers useful in the present disclosure are desirably soluble in the coating composition and/or the solvent present in the coating composition. The process according to the present disclosure can be conducted with a single olefinic monomer or a mixture of olefinic monomers.

Total monomer concentration in a coating composition according to the present disclosure may be at least in increasing order of preference, about 0.05, 0.1, 0.25, 0.5, 0.75, 1.0, 2.0, 2.5, 3.0, 3.5, 4.0, 4.5, 5.0, 5.5, 6.0% by weight, and at least for economy may be not more than about 7.0, 8.0, 9.0, 10, 11, 12, 13, 14, 15, 16, 17, 18, 19, 20, 25, 30, 35, 40, 45, 50, 55, 60, 65 or 75% by weight. Higher percentages of monomer may be used provided that the increased amount does not interfere with obtaining the benefits of the invention. In some embodiments, total monomer concentration in a coating composition according to the present disclosure desirably may be from 0.1 to 50% by weight, preferably from 5 to 15% by weight based on the total weight of the coating composition.

Optional components for the composition and concentrates may be one or more additive(s), such as wax, adhesion promoter, flow modifier, rheology modifier, stabilizer, catalyst, photoinitiator, biocide, and biostat.

The optional additive may desirably be selected based on preferred electric or dielectric properties as specified for the conformal coating design of the end-use device such as tablets, cell phones and the like. For example, where the additive may be selected for the end-use device for dielectric strength, the preferred wax additive may have a dielectric constant of greater than 1, more preferably >2, most preferably >4. Such additives may comprise functional groups such as C=O, or —O— or —NH— or aromatic rings to provide the specified dielectric properties for the conformal coating. Wetting agents and flow modifiers find utility within the invention to promote uniformity of thickness of the applied coating composition on the substrates such as printed circuit boards. Preferred examples include polydimethylsiloxanes, polyether-modified polydimethylsiloxanes, and polydimethylsiloxanes bearing functional groups including amines, carboxyl groups or phosphorus-based acid moieties.

Appropriately selected photoinitiators or combinations of photoinitiators in coating formulations absorb peak wavelength bands of the radiation source, such as mercury arc UV lamps, employed to initiate polymerization leading to curing at the surface as well as within the bulk of the coating. A skilled person in the art for energy curable compositions, mainly for UV light, LED and visible light curable compositions, also knows to combine suitable photoinitiators or types of photoinitiators along with co-initiators, synergists or catalysts to significantly improve curing efficiency and performance. Preferably, the photoinitiator is present in the coating composition in an amount of from 1 to 6 weight percent based on the total weight of the UV curable materials within the formulation, preferably at least 1, 1.5, 2, 2.5, or 3 and not more than 6, 5.5, 5.0, 4.5, 4, 3.5 or 3.

Traditional free radical photoinitiators useful for the present invention classified according to their chemical groups and include, but are not limited to: (1) hydroxyacetophenones, (2) alkylaminoacetophenones, (3) benzil ketals and dialkoxy acetophenones, (4) benzoin ethers, (5) phosphine oxides, (6) acyloximino esters, (7) photoacid generators, (8) photobase generators, (9) 2,2-Bis(2-chlorophenyl)-4,4,5,5-tetraphenyl-1,2-biimidazole (BCIM) and HABI, (10) benzophenones, (11) organic sulfur compounds such as thiols, (12) substituted benzophenones, (13) benzoylformate esters, (14) anthraquinones, (15) camphorquinones, (16) oxime esters, (17) anthracene proxy radicals, and mixtures thereof. Specific examples of such photoinitiators include, but are but not limited to: benzyldimethylamino-1-(4-morpholinophenyl)butanone-1; benzil dimethylketal; dimethoxyphenylacetophenone; a-hydroxybenzyl phenyl ketone; 1-hydroxy-1-methylethyl phenyl ketone; oligo-2-hydroxy-2-methyl-1-(4-(1-methylvinyl)phenyl)propanone; benzophenone; methylorthobenzoyl benzoate; methyl benzoyl formate; 2,2-diethoxyacetophenone; 2,2-disec. Butoxyacetophenone; p-phenylbenzophenone; 2-isopropyl thioxanthone; 2-methylanthraquinone; 2-ethylanthraquinone; 2-chloroanthraquinone; benzanthraquinone; benzyl; benzoin; benzoin methyl ether; benzoin isopropyl ether; a-phenylbenzoin; thioxanthone; diethylthioxanthone; 1,5-acetonaphthalene; 1-hydroxycyclohexyl phenyl ketone; ethyl p-dimethylaminobenzoate; titanocenes; dibenzylidene ketones; 1,2-diketones; ketocoumarins; and mixtures thereof.

Typical free radical photoinitiators useful in this invention are commercially available under tradenames that include: Irgacure® 184, Irgacure® 1173, Omnirad 102, Esacure KIP 150, Esacure KIP EM, Irgacure® 2959, Omnirad 669, Irgacure® 127, Irgacure® Micro-PICS, Esacure ONE, Irgacure® 907, Quadracure MMMP-3, Irgacure® 369, Omnipol 910, Quadracure BDMD-3, Irgacure® 379, Benzildimethyl ketal (BDK), Irgacure® 651 (DMPA), Diethoxyacetophenone (DEAP), Vicure® 10, Lucirin® TPO, Lucirin® TPO-L, Irgacure® 819, BAPO, Speedcure® PDO, Irgacure® PAG (103, 203, 108, 121), Irgacure® oxe 01, Irgacure® oxe 02, Esacure 1001M, Trigonal P1, Sandoray® 1000, Phenyl tribromomethyl sulphone (BMPS), Trichloromethyl-S-triazines, O-Nitrobenzyl carbamates, Ciba PLA-1, Irgacure® 907, Darocure® 1173, Ciba PLA-2, Speedcure® MBP, Esacure TZT, Genocure® MBB, Uvecryl® P36, Omnipol BP, Genopol BP-1, Speedcure® 7005, Goldcure 2700, Trigonal 12 (PBZ) (4-Phenylbenzophenone), Goldcure 2300, Speedcure® BMS, Esacure 1001M (sulphonylketone), Irgacure® MBF and Genocure® MBF, TX-A, Irgacure® 754 and 2-Ethylanthraquinone.

One skilled in the art of energy curable formulations can substitute free radically photo polymerizable components in the examples by cationically photopolymerizable monomers or oligomers. Conventional cationic photoinitiators potentially useful for such inventions are classified according to chemical groups and include but are not limited to: (1) sulphonium salts; (2) iodonium salts; (3) ferrocenium salts; and mixtures thereof.

Typical commercial examples of cation photoinitiators useful for such inventions are available under tradenames including: Irgacure® 250, Irgacure® 270, Irgacure® PAG 290, Irgacure® GSID 26-1, QL cure 211, QL cure 212, SP 150, Sp 170, Omnicat 550, Imnicat 555, Omnicat 650, Esacure 1187, Irgacure MacroCat, Hycure 810, Uvacure® 1600, Sarcat CD 1012, Omnicat 440, Omnicat 445, Irgacure® 250, UV 9310, Rhodorsil 2047, Rhodorsil® 2076, Irgacure® 261, Omnicat 320, Omnicat 430, Omnicat 432, Speedcure® 937, Speedcure® 938, Speedcure® 976 and 992. Molecular or polymeric co-initiators, synergists and catalysts useful for the present invention are classified based on chemical groups and include, but are not limited to: (1) primary, secondary and tertiary amines; (2) amides; (3) alpha amino acids; (4) thioxanthones; (5) thiols; and mixtures thereof. Specific examples useful for the invention include but are but not limited to: 2-ethylhexyl-p-dimethylaminobenzoate; ethyl 4-(dimethylamino) benzoate; trimethylolpropane tris (3-mercaptopropionate); methyldimethanolamine; poly (ethylene glycol) bis (p-dimethylaminobenzoate); polyethylene glycol-di (β-(4 (pacetylphenyl) piperazine)) propionate; and mixtures thereof.

Commercial available examples of co-initiators, synergists and catalysts useful for this invention include but are not limited to: Genocure® EHA, Genocure® EPD, Genocure® MEDA, Speedcure® DMB, Speedcure® EDB, Omnirad IADB, Omnipol ASA and Omnipol SZ, ITX (Isopropylthioxanthone), Kayacure DETX (Diethylthioxanthone), Speedcure® CTX (Chlorothioxanthone), Kayacure RTX (Dimethylthioxanthone), Kayacure DITX (Diisopropyl-thioxanthone), Speedcure® CPTX (1-Chloro-4-propoxythioxanthone), Speedcure® 7010, Omnipol TX, Genopol TX-1.

Adhesion promotors find utility within the invention to improve adherence of applied coating to substrate such as a printed circuit board. Preferred examples often possess functional groups such as amines, thiols, carboxyl as well as phosphorous based acids to provide adhesion of coating to metal trace or backing substrate.

In one embodiment the coating composition is provided as a concentrate comprising: a passivating agent, at least one binder component, and optionally solvent sufficient to uniformly dissolve and/or disperse the passivating agent and binder component to achieve a stable concentrate with no tendency to separate into distinct liquid phases or form solid precipitate visible to the unaided human eye, such that the separate phases cannot be readily reincorporated after storing at 25° C. for at least 1 month. The concentrate can be formulated to be diluted with a solvent to form use concentration or alternatively as a bath replenisher as is known in the art to supplement a previously formed bath. Alternatively, the coating composition can be provided as a ready to use solution.

A process of making a coating composition of the present disclosure comprises dissolving and/or dispersing the passivating agent and the binder component in at least one of a solvent or a reactive diluent. The coating composition components are stirred together in a container to form a bath, for example from single components, two or more separate combinations of components or a concentrate of the coating composition.

The present disclosure demonstrates a method of water-resistant coating of a substrate and in particular for water-resistant coating of a printed circuit board. The process is rapid and efficient and can be adapted to a wide range of substrates and metal traces. In one embodiment, a method of forming a polymer film on a substrate, for example for waterproofing a circuit board according to the disclosure comprises:
  a) applying the coating composition as described herein to a substrate surface comprising one or more electrically conductive traces affixed thereto, preferably the substrate is an electronic component, more preferably a circuit board, most preferably a printed circuit board;
  b) drying the coating composition on the substrate surface;
  c) optionally UV curing the coating composition on the substrate surface;
  d) during any of steps a)-c) reacting available reactive functional groups of binder component (B) and passivating agent (A) with coating composition components and optionally the electrically conductive traces, preferably metal traces, thereby depositing a passivating polymeric film, insoluble in water on the substrate surfaces.

Coated substrates according to the disclosure comprise at least one metal trace affixed to a substrate and a passivating polymer coating on at least one surface of the metal trace. In one embodiment the substrate is an electrically non-conductive material and the metal trace is an electrically conductive material, preferably a printed circuit board.

Thickness of the passivating polymer coating layer may range from about 0.2 to about 40 microns, with desirable ranges, depending on the binders chosen and the use environment, including from about 0.6 to 3.8 microns; 0.6 to less than 12 microns, such as for ultrathin coating applications; 8-15 microns or 11-25 microns, or as much as 40 microns or more for particular applications such as peelable coatings, provided that the thickness does not interfere with performance of the coating layer. Within this range, desirably coating thicknesses may be at least in increasing order of preference 0.2, 0.3, 0.4, 0.5, 0.6, 0.7, 0.9, 1.0, 1.2, 1.5, 1.7, 2.0, 2.2, 2.4, 2.5, 2.7, 3.0, 3.2, 3.5, 3.7, 3.8, 4.0, 4.2, 4.5, 4.7, 5.0, 5.2, 5.5, 5.7, 6.0, 6.2, 6.4, 6.5, 6.7, 6.9, 7.0 microns and at least for economy may be not more than in increasing order of preference 40, 35, 30, 25, 20, 19, 18, 17, 16, 15, 14, 13, 12, 11, 10, 9.75, 9.50, 9.25, 9.0, 8.7, 8.5, 8.3, 8.0, 7.7, 7.5, 7.2 microns. In one embodiment, the thickness ranges from about 700 nm to about 1600 nm, for ultrathin coatings.

The coating formed according to the present disclosure is water-resistant, meaning it is water-resistant to immersion for at least 30 minutes under water or an aqueous electrolyte, e.g. saline or artificial sweat, while under electrical power. The coating also significantly reduces the formation of dendrites between adjacent metal traces on a substrate. Dendrite formation is a problem with existing systems and can lead to failure of the circuit due to a short circuit forming between two traces via the dendrite. Use of the present disclosed process results in a coating that curtails dendrites formed between traces of a test circuit board when tested as described in the Examples below; preferably no dendrites are formed. This is far below the numerous dendrites formed during this test using conventional coating processes.

Prior to a coating step utilizing a coating composition in accordance with the present invention, at least a portion of the substrate to be coating, e.g. a metal surface of a metal trace, may be cleaned using any method known in the art for removing contaminants from the metal surface, such as solvent cleaning, cleaning with fluoro-based fluids, or plasma methods. The substrate surface may also be rinsed prior to coating, either with water alone or with a pre-rinse solution comprising one or more substances capable of further improving performance, e.g. adhesion, water-resistance, or the like of the polymeric coating subsequently formed on the substrate surface, including for example metal traces. So-called pre-conditioning treatments may be employed, but coating processes in the absence of a pre-conditioning step are also suitable.

Within this specification, embodiments have been described in a way which enables a clear and concise specification to be written, but it is intended and will be appreciated that embodiments may be variously combined or separated without departing from the invention. For example, it will be appreciated that all preferred features described herein are applicable to all aspects of the invention described herein.

In some embodiments, the invention herein can be construed as excluding any element or process step that does not materially affect the basic and novel characteristics of a composition, article or process. Additionally, in some embodiments the invention can be construed as excluding any element or process step not specified herein.

Although the invention is illustrated and described herein with reference to specific embodiments, the invention is not intended to be limited to the details shown. In the experiments disclosed in the present specification selected passivating agents were used in an exemplary manner to deposit a passivating polymeric coating on a printed circuit board thereby passivating metal traces on the board. It is but one example of an article that can benefit from a coating of the present invention. Rather, various modifications may be made in the details within the scope and range of equivalents of the claims and without departing from the invention. Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

EXAMPLES

Test Substrates:
Unless otherwise described herein, test substrates were commercially available, IPC-Association Connecting Electronics Industries (formerly the Institute for Printed Circuits, aka IPC) approved, PCB-B-25A test printed circuit boards (PCB). These test printed circuit boards were IPC/Surface Mount Technology Association (SMTA) compliant and met the guidelines for use in testing solder masks (IPC-SM-804C) and conformal coatings (IPC-CC-830A). Each test printed circuit board was 1.6 mm (0.062 inch) thick, FR-4 grade glass-reinforced epoxy laminate and was a simple print-and-etch with bare copper traces, which do not form a complete circuit, that is no current passes through the PCB-B-25A absent a corrosion induced conductive electrical pathway, i.e. a short circuit. Grid of PCB-B-25A used in testing was Grid F.

UV Cure Parameters

Unless otherwise described herein, test substrates coated with a UV curable coating composition, whether by a single or a multistep coating application process, were UV cured using a conveyor equipped with an H+ bulb. The UV energy source provided curing energy to the substrate surface sufficient to cure the coating. Depending on the initiator utilized, a minimum of at least one of the following energy levels was provided, as is known in the UV coating arts:

| Type of Ultraviolet Energy Supplied | mJoules/cm$^2$ |
|---|---|
| UVA | 807 |
| UVB | 758 |
| UVC | 250 |
| UVV | 775 |

Water-Resistance Test:

Effectiveness of the coating in providing water-resistance to the printed circuit boards of the examples was tested as follows: The coated test circuit boards were connected to an electrical voltage supply in the off position, immersed in water or an electrolyte solution ("artificial sweat"), and electrical voltage was then applied for 30 minutes. Unless otherwise described herein, saline electrolyte refers to artificial sweat; the composition of the artificial sweat is given below:

100 ml DI 5 g NaCl 5 g Na$_2$HPO$_4$-12H$_2$O 2 ml 99% Acetic Acid.

Short Circuit Formation: The voltage is chosen for the test between 3 and 30 V and is held constant for the duration of the test. Where no complete circuit is present, no current passes. Current readings increase from zero with the onset of corrosion-based degradation of the conductive traces resulting in short circuits resulting in current passage. During the 30 minute immersion, an in-line ammeter was used to detect current leakage from the electrified printed circuit board by measuring current passage through the circuit over the test period with less current observed being better. Readings were taken every 1 sec. for 30 minutes. The Avg. Current (mA) reported is a mean of the current measured across the entire 30 minute experiment. The Max. Current (mA) reported is the single highest current value observed over the 30 minute experiment.

Dendrite and Oxide Formation: Performance of the coating was also judged by the number of dendrites or formation of bulk oxides visible under 12× magnification between and on traces after the test, with fewer dendrites and less oxide showing better performance, where dendrites and formation of visually observable oxides are indicators of corrosion. A rating scale for each of dendrite and oxide formation separately is employed. For dendrites, the scale is represented by the letters A-D, with A signifying no dendrite formation, and increasing to D which signifies pervasive dendrites between every trace in the test area. Oxide formation is represented by the numbers 0-4, with 0 signifying no oxide formation in the test area, and increasing to 4 which signifies widespread oxide formation over 100% of the traces in the test area.

Example 1

In this example five different coating compositions were made with components as shown in Table 1-1 below.

TABLE 1-1

| Component (grams) | 1A | 1B | 1C | 1D |
|---|---|---|---|---|
| Poly(ethylene-co-vinyl acetate) 40% VA | 4.55 | 4.55 | 4.55 | 4.55 |
| Toluene | 35.45 | | 35.45 | |
| Methyl Isobutyl Ketone | | 34.75 | | 55.45 |
| Mercapto silane oligomer* | 1.5 | 1.5 | 4.55 | 4.55 |
| Xylene | 5 | | 5 | |
| Propylene glycol monomethyl ether acetate | | 5 | | 5 |

*Mercapto alkoxy silane oligomer

Coating compositions containing the ingredients and specified amounts in Table 1-1 were prepared by the following procedure. The 40% VA EVA polymer was dissolved in the first solvent listed, with stirring, at a temperature of 70° C. The second solvent is then added, followed by the specified thiol. Stirring continued until the coating composition is both clear and free of visible solids.

The coating compositions were then sprayed onto printed circuit boards with an air pressurized paint spray gun. The gun's pressure and number of spray passes made was adjusted such that coating thicknesses were between 8-15 microns. The boards were then thermally cured for 15 minutes at 90° C. followed by 10 minutes at 120° C.

These coated printed circuit boards were then subjected to the Water-resistance Test described above, at 3, 12, and 30 V bias under distilled water and at 20 V bias under the artificial sweat solution also described in the Water-resistance Test and the results are reported in Table 1-2 below.

For the coating compositions in Table 1-1, the effects of the solvent and EVA to thiol ratio on corrosion was determined and is displayed in Table 1-2.

TABLE 1-2

| Example # | Test Conditions | Avg. current (mA) | Max. current (mA) | Dendritic Growth Rating | Visible Corrosion Rating |
|---|---|---|---|---|---|
| 1A | 30 V water | 0.002 | 0.004 | A | 0 |
| 1B | 30 V water | 0.001 | 0.003 | C | 0 |
| 1C | 30 V water | 0.009 | 0.014 | A | 0 |
| 1D | 30 V water | 0.001 | 0.002 | B | 0 |
| 1A | 20 V sweat | 0.059 | 0.144 | A | 2 |
| 1B | 20 V sweat | 0.001 | 0.004 | A | 0 |
| 1C | 20 V sweat | 2.46 | 3.293 | C | 3 |
| 1D | 20 V sweat | 0.001 | 0.002 | B | 0 |
| 1A | 12 V water | 0.01 | 0.029 | N/R | N/R |
| 1B | 12 V water | 0.001 | 0.003 | N/R | N/R |
| 1C | 12 V water | 2.029 | 10.458 | N/R | N/R |
| 1D | 12 V water | 0.001 | 0.002 | N/R | N/R |
| 1A | 3 V water | N/R | N/R | N/R | N/R |
| 1B | 3 V water | N/R | N/R | N/R | N/R |
| 1C | 3 V water | 0.012 | 0.015 | N/R | N/R |
| 1D | 3 V water | 0.001 | 0.002 | N/R | N/R |

N/R indicates not rated

The toluene/xylene solvent system performed worse than the MIBK/PMA system, with the largest effect at the 50:50 EVA to thiol ratio.

Example 2

Coating compositions containing the ingredients and specified amounts in Table 2-1 were prepared by the following procedure. The specified EVA polymer was dissolved in the first solvent listed, with stirring, at a temperature of 70° C. The second solvent is then added, followed by the specified thiol. Stirring continued until the coating composition is both clear and free of visible solids.

This study also included a commercial UV cure urethane acrylate product as a comparative example deposited at its typical coating thickness of 50 microns and at a thickness below its recommended usage of 12 microns.

TABLE 2-1

| Component (grams) | 2A | 2B | 2C | 2D | 2E |
|---|---|---|---|---|---|
| Poly(ethylene-co-vinyl acetate) 40% VA | 6.48 | | 6.65 | | 5.9 |
| Poly(ethylene-co-vinyl acetate) 25% VA | | 6.48 | | 6.65 | |
| Toluene | | 37.92 | | 29.95 | |
| Methyl Isobutyl Ketone | 43.62 | | 29.95 | | 40.4 |
| Pentaerythritol tetrakis(3-mercaptopropionate) | 2.1 | 2.1 | 1 | 1 | 5.9 |
| Xylene | | 14.2 | | 14.6 | |
| Propylene glycol monomethyl ether acetate | 14.2 | | 14.6 | | 13 |

The coating compositions other than the comparative example commercial product were then sprayed onto printed circuit boards with an air pressurized paint spray gun. The gun's pressure and number of spray passes made was adjusted such that coating thicknesses were between 8-15 microns. The boards were then thermally cured for 15 minutes at 90° C. followed by 10 minutes at 120° C. The commercial product was applied and cured to a thickness of 12 and 50 microns.

These coated printed circuit boards were then subjected to the Water-resistance Test described above, at 3, 12, and 30 V bias under distilled water and at 20 V bias under the artificial sweat solution also described in the Water-resistance Test and the results are shown below in Table 2-2.

TABLE 2-2

| Ex. | Test Conditions | Avg. current (mA) | Max current (mA) | Dendritic Growth Rating | Visible Corrosion Rating |
|---|---|---|---|---|---|
| 2A | 30 V water | 0.072 | 0.144 | A | 0 |
| 2B | 30 V water | 0.391 | 0.792 | A | 1 |
| 2C | 30 V water | 0.205 | 0.83 | N/R | N/R |
| 2D | 30 V water | 0.001 | 0.002 | A | 0 |
| 2E | 30 V water | 0.015 | 0.021 | A | 0 |
| PC40 12 u | 30 V water | 64.453 | 116.59 | C | 1 |
| PC40 50 u | 30 V water | 0.053 | 0.109 | A | 0 |
| 2A | 20 V sweat | 0.53 | 2.338 | A | 2 |
| 2B | 20 V sweat | 0.42 | 2.184 | A | 2 |
| 2C | 20 V sweat | 0.388 | 1.705 | A | 2 |
| 2D | 20 V sweat | 0.01 | 0.107 | A | 0 |
| 2E | 20 V sweat | 0.08 | 0.112 | A | 0 |
| PC40 12 u | 20 V sweat | 0.46 | 4.857 | A | 2 |
| PC40 50 u | 20 V sweat | 0.002 | 0.014 | A | 0 |
| 2A | 12 V water | 0.172 | 0.252 | A | 0 |
| 2B | 12 V water | 0.446 | 1.128 | A | 1 |
| 2C | 12 V water | 0.244 | 0.426 | A | 1 |
| 2D | 12 V water | 0.001 | 0.002 | A | 0 |
| 2E | 12 V water | 0.002 | 0.003 | A | 0 |
| PC40 12 u | 12 V water | 6.107 | 17.1 | C | 2 |
| PC40 50 u | 12 V water | 2.58 | 5.105 | A | 0 |
| 2A | 3 V water | 0.001 | 0.002 | A | 0 |
| 2B | 3 V water | 0.001 | 0.002 | A | 0 |
| 2C | 3 V water | 0.001 | 0.002 | A | 0 |
| 2D | 3 V water | 0.001 | 0.002 | A | 0 |
| 2E | 3 V water | 0.003 | 0.004 | A | 0 |

TABLE 2-2-continued

| Ex. | Test Conditions | Avg. current (mA) | Max current (mA) | Dendritic Growth Rating | Visible Corrosion Rating |
|---|---|---|---|---|---|
| PC40 12 u | 3 V water | 22.891 | 28.44 | C | 1 |
| PC40 50 u | 3 V water | 0.704 | 1.183 | A | 0 |

For the coating compositions in Table 2-1, the effects of the solvent and EVA to thiol ratio on corrosion was determined and is displayed in Table 2-2. The results show that multiple variations of the invention perform better at the lower coating thickness of 8-15 microns than the commercial product, which requires higher coating thickness for good corrosion performance.

FIG. 1 shows a graph of current leakage test results from test PCB substrates coated according to Example 1: Formulation 2D and Comparative Example 1: Formulation PC40 12u in the Water-Resistance Test in water at 30 V for 30 minutes. Amounts of current leakage were measured at one second increments over the period with less being better. Graph line markers are provided at 50 second intervals. For Comparative Example 1 test PCBs, measured current leakage rose quickly over the 30 minute test period, in contrast Example 1, which had current leakage of less than 1/10,000 of 1 mA. FIG. 1 shows this negligible level of current leakage as a flat line near zero.

Within the invention variations, the 40% vinyl acetate EVA polymer performed best under conditions discovered in the previous example with MIBK/PMA solvent and at the 50:50 EVA to thiol ratio. The 25% vinyl acetate EVA polymer, however, performed best at the highest EVA thiol ratio, and with the other solvent, demonstrating that these conditions must be tailored to the polymer chosen.

Example 3

Coating compositions containing the ingredients and specified amounts in Table 3-1 were prepared by the following procedure. The 40% VA EVA polymer was dissolved in the first solvent listed, with stirring, at a temperature of 70° C. The second solvent is then added, followed by the specified thiol, triazole, or other additive. Stirring continued until the coating composition is both clear and free of visible solids.

TABLE 3-1

| Component (grams) | 3A | 3B | 3C | 3D | 3E |
|---|---|---|---|---|---|
| Poly(ethylene-co-vinyl acetate) 40% VA | 5.9 | 5.9 | 5.9 | 5.9 | 5.9 |
| Methyl Isobutyl Ketone | 26.6 | 26.6 | 26.6 | 26.6 | 26.6 |
| Propylene glycol monomethyl ether acetate | 13 | 13 | 13 | 13 | 13 |
| 2-Mercaptobenzothiazole | 5.9 | | | | |
| Vitamin E | | 5.9 | | | |
| 2,5-Dimercapto-1,3,4-thiadiazole | | | 5.9 | | |
| Benzotriazole | | | | 5.9 | |
| Cobratech 937 (proprietary azole blend) | | | | | 5.9 |

The coating compositions were then sprayed onto printed circuit boards with an air pressurized paint spray gun. The gun's pressure and number of spray passes made was adjusted such that coating thicknesses were between 8-15 microns. The boards were then thermally cured for 15 minutes at 90° C. followed by 10 minutes at 120° C.

These coated printed circuit boards were then subjected to the Water-resistance Test described above, at 30 V bias under distilled water and at 20 V bias under the artificial sweat solution also described in the Water-resistance Test and the results are shown below in Table 3-2.

TABLE 3-2

| Ex. | Test Conditions | Avg. current (mA) | Max current (mA) | Dendritic Growth Rating | Visible Corrosion Rating |
|---|---|---|---|---|---|
| 3A | 30 V water | 0.772 | 2.597 | D | 0 |
| 3B | 30 V water | 98.435 | 125.01 | C | 1 |
| 3C | 30 V water | 6.538 | 15.774 | C | 1 |
| 3D | 30 V water | 18.617 | 47.443 | C | 1 |
| 3E | 30 V water | 0.087 | 0.243 | A | 1 |
| 3A | 20 V sweat | 0.69 | 3.468 | D | 0 |
| 3B | 20 V sweat | 11.896 | 20.076 | B | 4 |
| 3C | 20 V sweat | 0.798 | 8.189 | B | 2 |
| 3D | 20 V sweat | 1.438 | 5.316 | B | 2 |
| 3E | 20 V sweat | 0.306 | 0.627 | B | 2 |

For the coating compositions in Table 3-1, the effects of changing the thiol to other small molecules was determined and is displayed in Table 3-2. The Vitamin E system performed very poorly, demonstrating that the (thiol/triazole) may not be solely a reducing agent. Thiols and triazoles were effective.

Example 4

A coating composition containing the ingredients and specified amounts in Table 4-1 were prepared by the following procedure. The 40% VA EVA polymer was dissolved in the first solvent listed, with stirring, at a temperature of 70° C. The second solvent is then added, followed by the specified thiol. Stirring continued until the coating composition is both clear and free of visible solids. This study also includes a commercial product comparative example at its typical coating thickness of 50 microns, as identified in Example 2.

TABLE 4-1

| Component (grams) | 1B |
|---|---|
| Poly(ethylene-co-vinyl acetate) 40% VA | 4.55 |
| Methyl Isobutyl Ketone | 34.75 |
| Mercapto silane oligomer | 1.5 |
| Propylene glycol monomethyl ether acetate | 5 |

Circuit boards for testing had polyamide masking tape applied to a portion of the test area as a mask. The coating compositions were then sprayed onto printed circuit boards with an air pressurized paint spray gun. The gun's pressure and number of spray passes made was adjusted such that coating thicknesses were between 8-15 microns. The boards were then thermally cured for 15 minutes at 90° C. followed by 10 minutes at 120° C. The commercial product was applied and cured according to its recommended usage.

After curing, the masks were removed to simulate a repair, exposing uncoated test area on the circuit board. Formula 1B of Example 1 was then applied to these exposed areas via spray gun as above, and to all boards' exposed areas regardless of the original formula used to coat the board and dried for 15 minutes at 90° C. followed by 10 minutes at 120° C.

These printed circuit boards with repaired coating were then subjected to the Water-resistance Test described above, specifically testing on the repaired area, at 30 V bias under distilled water and at 20 V bias under the artificial sweat solution also described in the Water-resistance Test and the results are shown below in Table 4-2.

TABLE 4-2

| Ex | Test Conditions | Avg. current (mA) | Max current (mA) | Dendritic Growth Rating | Visible Corrosion Rating |
|---|---|---|---|---|---|
| 2B | 30 V water | 0.003 | 0.007 | A | 1 |
| PC 40 50 u | 30 V water | 0.004 | 0.006 | A | 0 |
| 2B | 20 V sweat | 3.421 | 8.808 | A | 1 |
| PC 40 50 u | 20 V sweat | 1.729 | 7.994 | A | 1 |

For the repaired coated boards, the effects of the repairs were determined and are displayed in Table 4-2. The repaired areas had excellent performance in the 30 V distilled water test. Both also provided protection in the 20 V artificial sweat testing, but not to the same standard as the 30 V distilled water.

Example 5

A coating composition containing the ingredients and specified amounts in Table 5-1 were prepared by the following procedure. The 40% VA EVA polymer was dissolved in the first solvent listed, with stirring, at a temperature of 70° C. The second solvent is then added, followed by the specified thiol. Stirring continued until the coating composition is both clear and free of visible solids.

TABLE 5-1

|  | 5A |
|---|---|
| Poly(ethylene-co-vinyl acetate) 40% VA | 5.9 |
| Methyl Isobutyl Ketone | 26.6 |
| Pentaerythritol tetrakis(3-mercaptopropionate) | 5.9 |
| Propylene glycol monomethyl ether acetate | 13 |

Printed circuit boards were then dipped in the coating composition while being held vertically. The boards were allowed to dry for 1 hour at room temperature before being thermally cured for 15 minutes at 90° C. followed by 10 minutes at 120° C. Coating thickness was determined to be 3.8 microns.

These coated printed circuit boards were then subjected to the Water-resistance Test described above at 30 V bias under distilled water and at 20 V bias under the artificial sweat solution also described in the Water-resistance Test. For the coating compositions in Table 5-1, the effects of dip application were determined and are displayed in Table 5-2.

TABLE 5-2

| Formula # | Test Conditions | Avg. current (mA) | Max current (mA) | Dendritic Growth Rating | Visible Corrosion Rating |
|---|---|---|---|---|---|
| 5A | 30 V water | 2.513 | 19.302 | B | 3 |
| 5A | 20 V sweat | 10.78 | 125.79 | A | 3 |

The application was shown to be protective, but not as protective as spray application.

Example 6

Coating compositions containing the ingredients and specified amounts in Table 6-1 were prepared by the following procedure. The 40% VA EVA polymer was dissolved in the first solvent listed, with stirring, at a temperature of 70° C. The second solvent is then added, followed by the specified thio-compound. Stirring continued until the coating composition is both clear and free of visible solids.

TABLE 6-1

|  | 6A |
| --- | --- |
| Poly(ethylene-co-vinyl acetate) 40% VA | 5.9 |
| Methyl Isobutyl Ketone | 26.6 |
| Propylene glycol monomethyl ether acetate | 13 |
| 2-Thiophenecarboxylic acid | 5.9 |

The coating composition was then sprayed onto printed circuit boards with an air pressurized paint spray gun. The gun's pressure and number of spray passes made was adjusted such that coating thicknesses were between 8-15 microns. The boards were then thermally cured for 15 minutes at 90° C. followed by 10 minutes at 120° C.

These coated printed circuit boards were then subjected to the Water-resistance Test described above, at 30 V bias under distilled water and at 20 V bias under the artificial sweat solution also described in the Water-resistance Test. For the coating composition in Table 6-1, the effects of changing the thiol to other small molecules was determined and is displayed in Table 6-2. The thiophene was found to be effective.

TABLE 6-2

| Ex. | Test Conditions | Avg. current (mA) | Max current (mA) | Dendritic Growth Rating | Visible Corrosion Rating |
| --- | --- | --- | --- | --- | --- |
| 6A | 30 V water | 9.327 | 50.34 | C | 1 |
| 6A | 20 V sweat | 0.694 | 2.103 | A | 2 |

Example 7: UV Curable Coating Composition

Coating compositions containing the materials and specified amounts shown in Table 7-1 and 7-2 were prepared by the following procedure. Component 7A was prepared by combining the materials recited in Table 7-1 with mixing to achieve a clear solution.

TABLE 7-1

| Component 7A | |
| --- | --- |
| Material | Wt. (g) |
| Ethanol | 98.0 |
| Triethylenetetramine | 2.0 |
| Total | 100.0 |

Component 7B was prepared by combining the materials recited in Table 7B with simple mixing.

TABLE 7-2

| Component 7B | |
| --- | --- |
| Material | Wt. (g) |
| Hexanediol diacrylate | 12.0 |
| 50 wt. % polyester resin/50 wt. % tripropylene glycol diacrylate (1:1 ratio) | 2.0 |

TABLE 7-2-continued

| Component 7B | |
| --- | --- |
| Material | Wt. (g) |
| 50 wt. % nanosilica/50 wt % Hexanediol diacrylate (1:1 ratio) | 11.2 |
| C24-26 saturated primary alcohol, branched | 0.4 |
| Liquid Acrylated Polydimethylsiloxane | 0.09 |
| Butyl acetate | 4.8 |
| Pentaerythritol tetrakis (3-mercaptopropionate) | 3.2 |
| Total | 33.7 |

Component 7A was used as a precoat layer over which Component 7B, the UV-curable coating mixture was applied. Component 7A was sprayed onto test printed circuit boards with an air pressurized paint spray gun followed by drying at ambient temperature (about 25° C.) for 5 minutes to form an amine precoat-layer, which after drying, measured 0.6 g/m2.

Component 7B was then applied over the precoat-layer and allowed to dry 10 minutes at ambient temperature, thereafter the Component 7A/B coating was UV cured using a conveyor equipped with an H+ bulb, as described above in UV Cure Parameters. Total cured coating thickness of the combined layers was 25 microns.

Sets of coated printed circuit boards were then subjected to the Water-Resistance Test described above, a first set at 30 V under distilled water and a second set at 20 V under saline electrolyte, and results are shown in the Table 7-3, below.

TABLE 7-3

| Test results of Example 7 | | | | | |
| --- | --- | --- | --- | --- | --- |
| Formula # | Test Conditions | Avg. current (mA) | Max current (mA) | Dendritic Growth Rating | Visible Corrosion Rating |
| 7A + B | 3 V water | ND | ND | A | 0 |
| 7A + B | 12 V water | ND | ND | A | 0 |
| 7A + B | 20 V saline | 0.001 | 0.002 | A | 0 |
| 7A + B | 30 V water | 0.001 | 0.003 | B | 0 |

ND: not determined.

Example 8: UV Curable Coating Composition Forming Ultra-Thin Coating Layer

Coating composition 8 containing the materials and specified amounts shown in Table 8-1 were prepared by combining the materials with mixing to achieve a uniform mixture.

TABLE 8-1

| Material | Wt. (g) |
| --- | --- |
| Nitrile rubber 5% solution in methylisobutyl ketone | 44.62 |
| Mercapto alkoxy silane oligomer | 0.56 |
| 2-Hydroxy-2-methyl-1-phenyl-propan-1-one | 0.14 |
| Methylisobutyl ketone | 52.8 |
| Total | 98.12 |

Coating composition of Example 8 was sprayed onto printed circuit boards with an air pressurized paint spray gun followed by drying at 70° C. for 10 minutes after which it was UV cured on a conveyor equipped with an H+ bulb according to the UV curing procedure described herein under UV Cure Parameters. After drying and cure, the applied coating thickness was measured to be 900 nm.

Coated printed circuit boards were then subjected to the Water-Resistance Test described above, at 3 V under distilled water and results are shown in the Table 8-2, below.

TABLE 8-2

| Formula # | Test Conditions | Avg. current (mA) | Dendritic Growth Rating | Visible Corrosion Rating |
|---|---|---|---|---|
| Example 8 | 3 V water | 1.35 | B | 0 |

Example 9 UV Curable Coating Composition Forming Ultra-Thin Coating Layer

Coating compositions 9A and 9B containing the materials and specified amounts shown in Table 9-1 were prepared by combining the materials with mixing to achieve a uniform mixture.

TABLE 9-1

| Material Wt. (g) | 9A | 9B |
|---|---|---|
| 3.5 wt. % solution of Polyisobutylene diacrylate in toluene | 18.0 | 18.0 |
| Mercapto alkoxy silane oligomer | 0.42 | 0.42 |
| Triethyl amine | 0.01 | 0.01 |
| 2-Hydroxy-2-methyl-1-phenyl-propan-1-one | 0.03 | — |
| Total | 18.46 | 18.43 |

Coatings 9A and 9B were sprayed onto printed circuit boards with an air pressurized paint spray gun followed by 5 minutes drying at ambient temperature (about 25° C.) then heated drying at 70° C. for 10 minutes after which the dried coatings were UV cured on a conveyor equipped with an H+ bulb according to the UV curing procedure described UV Cure Parameters. After drying and cure, the applied coating thickness was measured to be 704 nm and 1570 nm respectively.

The coated printed circuit boards were then subjected to the Water-Resistance Test as described in the Table 9-2 below at an applied bias of 3 V in water.

TABLE 9-2

| Formula # | Test Conditions | Avg. current (μA) | Dendritic Growth Rating | Visible Corrosion Rating |
|---|---|---|---|---|
| Example 9A | 3 V water | 610 microamps | A | 0 |
| Example 9B | 3 V water | 6 microamps | A | 0 |

Example 10—Effect of Additives

A formulation using a mercapto alkoxy silane oligomer provides a thiol functional group and a silane secondary functional group on the same molecule. The thiol bearing silanol precursors upon hydrolysis yield thiol functional silanes thereby conveniently provide a film forming polymer useful as both the passivating agent and the binder component. Concentrates were made as shown in the table below.

TABLE 10-1

| Formulations | % Coating composition* | % flow and leveling additives | % Waxy Additive | Coating thickness in microns |
|---|---|---|---|---|
| Example 10A (Comparative) No additive | 97 | 3 | 0 | 2.4 |
| Example 10B additive (C20 waxy alcohol) | 94 | 3 | 3 | 0.6 |
| Example 10C additive (C25 waxy alcohol) | 94 | 3 | 3 | 0.8 |
| Example 10D additive (C29 waxy alcohol)/diol) | 94 | 3 | 3 | 1.6 |

*mercapto alkoxy silane oligomer in solvent used as both passivating agent and binder.

The above concentrate formulations were diluted with butyl acetate to achieve a coating composition of sprayable consistency for use in an air pressurized paint spray gun. Each coating composition was sprayed onto printed circuit boards with followed by 5 minutes drying at ambient temperature (about 25° C.) then heated drying at 126° C. for 5 minutes.

The coated printed circuit boards were then subjected to the Water-Resistance Test as described in the Table 10-2 below at an applied bias of 3 V in water.

TABLE 10-2

| Formulation/ Additive | Test Conditions | Avg. Current (mA) | Dendritic Growth Rating | Visible Corrosion Rating | Thickness (microns) |
|---|---|---|---|---|---|
| Example 10A (None) | 3 Volts water | 4.2 | C | 1 | 2.4 |
| Example 10B C20 2-octyl-1-dodecanol waxy alcohol | 3 Volts water | 1.8 | A | 1 | 0.6 |
| Example 10C C25 branched waxy alcohol | 3 Volts water | 0.4 | A | 1 | 0.8 |
| Example 10D C29 waxy alcohol/diol | 3 Volts water | 0.1 | A | 0 | 1.6 |

Example 11 Plug-N-Play Example

The following examples provide conformal coating compositions and coated PCBs having a coating film of a selected hardness. Coating solutions containing the ingredients and specified amounts in Table 11-1 were prepared by the following procedure. Materials were dissolved in solvent in the order listed. Low and high passivate level formula were used to prepare adjustable adhesion examples. Formulations were applied using a conventional air pressurized spray gun.

Adhesion Testing

Peel off adhesion: Adhesion was tested by first placing an adhesive masking layer on top of the coating for the 20V sweat test (see next section for details). After the sweat test the adhesive masking was removed. If the waterproof coating was completely removed by the action of pulling the adhesive masking layer, then the coating is considered peelable. Note if the coating has good adhesion. Good adhesion: The coating was not removed with maskant.

Partial peel off: Part of coating was removed with maskant.
Peelable: Entire coating could be peeled off PCB.

Cross hatch: 1 mm crosshatch was done over copper and PCB. 100% of coating remains on PCB; Fail: 0% of coating remains on PCB This removability is beneficial for rework of the PCB. As the results of table 11-2 show below the coatings show either good adhesion with low thiol level (Examples 11D, 11F, 11H) or partial peel off capability with very high thiol levels (Examples 11A, 11B, 11C, 11E, 11G). The comparative does not have the adjustable adhesion.

The coating film has viscoelastic properties and passivating activity which both contribute to providing a water-resistant connection to conductive surfaces of the PCB in the presence of the coating layer at the interface of the separate connector and the PCB conductive surface. In some embodiments, the conductor pierces the conformal coating thereby establishing an electrical connection with the PCB that is a water resistant electrical connection. In other embodiments the conformal coating need not be pierced to achieve the electrical connection with the PCB that is a water resistant electrical connection.

By virtue of modified coating hardness and the passivating agent, coatings of the disclosure are suitable for use as plug n play waterproof electrical connections. Plug in electrical conductivity of the coating facilitates addition of electronic components, e.g. microchip or other component, to a PCB by piercing and/or simple low force plugging into an empty connection point on a PCB, while retaining electrical conductivity and water resistance the dried conformal coating.

TABLE 11-1

Plug n Play Test Compositions

| Plug n Play Example (g) | Passivating Agent[1] | Film Forming Polymer[2] | Additive Amount | Additive | Siloxane Flow Additive[3] | N-Butyl Acetate |
|---|---|---|---|---|---|---|
| 11A | 16.73 | 16.22 | 1.76 | Additive 1* | 0.25 | 65.04 |
| 11B | 16.42 | 15.15 | 3.73 | Additive 2** | 0.5 | 64.20 |
| 11C | 17.65 | 17.11 | 0 | | 0.27 | 64.97 |
| 11D | 1.66 | 33.26 | 0 | | 0.11 | 64.97 |
| 11E | 16.73 | 16.22 | 1.76 | Additive 3*** | 0.25 | 65.04 |
| 11F | 1.61 | 31.5 | 1.75 | Additive 3*** | 0.10 | 65.03 |
| 11G | 16.73 | 16.22 | 1.76 | Additive 4**** | 0.25 | 65.04 |
| 11H | 1.61 | 31.5 | 1.75 | Additive 4**** | 0.10 | 65.03 |

[1]Passivating agent was Pentaerythritol tetrakis(3-mercaptopropionate).
[2]Film forming polymer was soluble in the coating composition and is a commercially available thermoplastic polyester polymer having a MP of approx. 100° C.
*Additive 1: Liquid hydroxylated polyester adhesion promoter, different from the film forming polyester.
**Additive 2: Reactive additive was a blocked isocyanate reactive with mercaptan at drying temperatures.
***Additive 3: A polycaprolactone waxy additive having a dielectric constant of 2.9, insoluble but uniformly dispersible in the coating composition, different from the film forming polyester polymer.
****Additive 4: Triol of a polycaprolactone polymer waxy additive.
[3]Siloxane flow additive was a polyether siloxane polymer commercially available from Evonik.

Plug-n-play refers to coatings enabling simple low force push into place assembly of an electrical component into a device, which benefits quick manufacturing, reworking and service environment repair processes. This also provides faster and lower cost manufacturing of circuit boards and consumer electronics. Example microchips with I/O (input/output) pins that serve as piercing connections through conformal coating are known in the art and typically use pin-type metal connectors for assembly on the PCB.

TABLE 11-2

Plug-n-Play Test Results

| Example # | Thickness (micron) | Withstanding Voltage Limit* (V) | Peel off adhesion | Crosshatch adhesion | Vertical Plug-in (grams force) | 20 V Sweat Dendrite Rating | 20 V Sweat Corrosion Rating | Avg. Curr. (mA) | Max Curr. (mA) |
|---|---|---|---|---|---|---|---|---|---|
| 11A | 12 | 2800 | Partial peel off | Fail | 538 | A | 1 | 0.001 | 0.002 |
| 11A | 20 | 2500 | Partial peel off | Fail | 302 | A | 1 | 0.001 | 0.002 |
| 11B | 11 | 2000 | Partial peel off | Fail | 582 | A | 2 | 0.16 | 0.7 |
| 11C | 40 | 2800 | Partial peel off | Fail | 550 | A | 0 | 0.03 | 0.08 |
| 11D | 12 | 2000 | Good Adhesion | 100% | 5080 | A | 0 | 0.03 | 0.15 |
| 11D | 20 | 2000 | Good Adhesion | 100% | 1900 | A | 0 | 0.001 | 0.002 |
| 11E | 12 | 2000 | Partial peel off | Fail | 241 | A | 1 | 0.65 | 2.2 |

TABLE 11-2-continued

Plug-n-Play Test Results

| Example # | Thickness (micron) | Withstanding Voltage Limit* (V) | Peel off adhesion | Crosshatch adhesion | Vertical Plug-in (grams force) | 20 V Sweat Dendrite Rating | 20 V Sweat Corrosion Rating | Avg. Curr. (mA) | Max Curr. (mA) |
|---|---|---|---|---|---|---|---|---|---|
| 11E | 20 | 2500 | Partial peel off | Fail | 255 | A | 0 | 0.016 | 0.07 |
| 11F | 12 | 3300 | Good Adhesion | 100% | 3020 | A | 0 | 0.001 | 0.07 |
| 11F | 20 | 2000 | Good Adhesion | 100% | 4938 | A | 0 | 0.001 | 0.04 |
| 11G | 12 | 2000 | Partial peel off | Fail | 407 | A | 2 | 2.1 | 13 |
| 11H | 12 | 1800 | Good Adhesion | 100% | 406 | A | 1 | 0.15 | 0.57 |
| 11H | 20 | 2000 | Good Adhesion | 100% | 300 | A | 0 | 0.001 | 0.04 |
| Comp. Ex. 11I | 12 | 2000 | Good Adhesion | 100% | 13540 | A | 2 | 0.5 | 5 |
| Comp. Ex. 11J | 50 | 1800 | Good Adhesion | 100% | 17760 | A | 0 | 0.002 | 0.005 |

*per IPC-TM-650 TEST METHODS MANUAL

Test results are shown in Table 11-2. The tests measured features of cured conformal coatings, such as Withstanding Voltage Limit, adhesion and force required to penetrate a cured layer sufficient to establish an electrical connection, to assess suitability for use as a plug and play type coating, as well as corrosion resistance and Average and Maximum Current Passage testing described herein.

Figure 2:
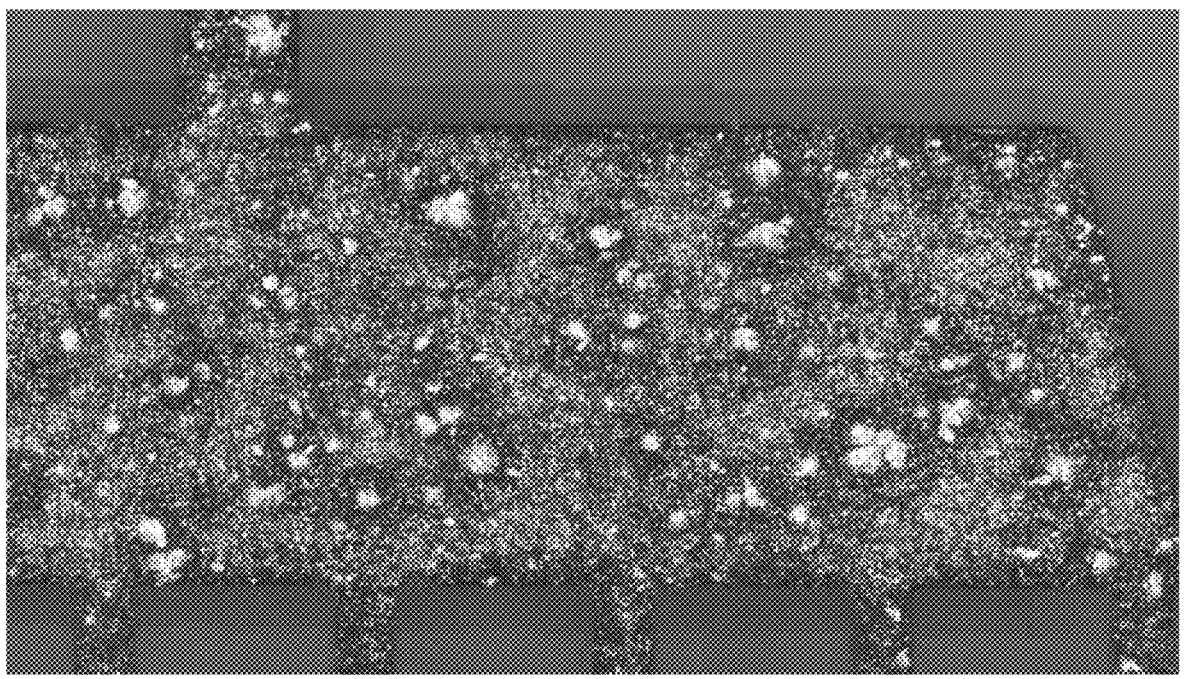
FIG. 2 is confocal image, at magnification 10× using polarized light, of a printed circuit board coated according to Example 11F at 12 microns thickness.

The 12 micron thick coating of Example 11F containing polycaprolactone (PCL), which is used to increase the dielectric breakdown strength of the coating was examined using a Zeiss LSM 800 Confocal Microscope using polarized light. FIG. 2 is a confocal image, at magnification 10× using polarized light, of the printed circuit board coated according to Example 11F at 12 microns thickness. Polycaprolactone shows as the bright spots in the coating that can be seen using polarized light from the confocal microscope. The polycaprolactone is distributed across the surface of the printed circuit board. Example 11F at 12 microns thickness showed 100% adhesion, Withstanding Voltage limit of 3000 Volts, and superior corrosion and current passage resistance. The dielectric strength is the essential property of plastic insulators that makes them an outstanding protection for devices against parts under high voltage.

Example 12

This study examines the effects of three flow modifier additives and some of their combinations relative to each other. Coating solutions containing the ingredients and specified amounts in Table 12-1 were prepared by the following procedure. The specified polyester polymer was dissolved in the solvent, with stirring, at a temperature of 70° C. The thiol was then added, followed by the remaining components. Stirring continued until the coating solution is both clear and free of visible solids.

TABLE 12-1

| Material | 12A | 12B | 12C | 12D |
|---|---|---|---|---|
| Butyl Acetate | 10.40 | 10.43 | 10.47 | 10.51 |
| Film Forming Polymer† | 10.25 | 10.25 | 10.25 | 10.25 |
| Trimethylolopropane mercaptpopropionate | 3.42 | 3.42 | 3.42 | 3.42 |
| Siloxane Flow Additive *1 | 0.00 | 0.00 | 0.11 | 0.11 |
| Siloxane Flow Additive *2 | 0.03 | 0.00 | 0.03 | 0.00 |
| Siloxane Flow Additive *3 | 0.00 | 0.02 | 0.00 | 0.02 |
| Liquid Hydroxylated Polyester Adhesion Promoter | 0.73 | 0.73 | 0.73 | 0.73 |
| TOTAL | 24.83 | 24.85 | 25.01 | 25.04 |

†Film Forming Polymer was soluble in the coating composition and is a commercially available thermoplastic polyester polymer having a MP of approx. 100° C..
*1 commercially available from Evonik Corporation described by the manufacturer as a polyether siloxane copolymer.
*2 commercially available from BYK-Chemie GmbH described by the manufacturer as a polyether modified polydimethylsiloxane 12% solids in organic solvent.
*3 commercially available from BYK-Chemie GmbH described by the manufacturer as a polyether modified polydimethylsiloxane.

The coating solutions were sprayed onto printed circuit boards with an air pressurized paint spray gun. The gun's pressure and number of spray passes made was adjusted such that coating thicknesses were between 8-15 microns. The boards were then thermally cured for 15 minutes at 90° C. followed by 10 minutes at 120° C.

These coated printed circuit boards were then subjected to the Water-resistance Test described above, at 18 and 30 V bias under distilled water and at 20 V bias under the artificial sweat solution also described in the Water-resistance Test.

For the coating solutions in Table 12-1, the effects of the flow modifiers and their combinations are displayed in Table 12-2. The formulae 12B and 12D both have similar, superior performance and share a flow modifier.

TABLE 12-2

| Formula # | Test Conditions | Avg. current (mA) | Max current (mA) | Dendritic Growth Rating | Visible Corrosion Rating |
|---|---|---|---|---|---|
| 12A | 18 V Water | 0.001 | 0.002 | A | 2 |
| 12B | 18 V Water | 0.001 | 0.002 | A | 0 |
| 12C | 18 V Water | 0.034 | 0.04 | C | 2 |
| 12D | 18 V Water | 0.001 | 0.002 | A | 0 |
| 12A | 20 V Sweat | 0.07 | 0.118 | A | 2 |
| 12B | 20 V Sweat | 0.001 | 0.003 | A | 0 |
| 12C | 20 V Sweat | 0.014 | 0.032 | A | 2 |
| 12D | 20 V Sweat | 0.002 | 0.004 | A | 0 |

The foregoing disclosure has been described in accordance with the relevant legal standards, description of the embodiments has been provided for purposes of illustration thus the description is exemplary rather than limiting in nature. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

Variations and modifications to the disclosed embodiment may become apparent to those skilled in the art and do come within the scope of the disclosure. Accordingly, the scope of legal protection afforded this disclosure can only be determined by studying the following claims.

We claim:

1. A circuit board water-proofing coating composition, comprising:
   A) at least one dissolved and/or dispersed passivating agent containing a molecule comprising a thio-functional group and/or an azolic moiety, the passivating agent in a concentration greater than a solubility limit of the passivating agent in the binder component;
   B) a dissolved and/or dispersed binder component comprising one or more of the following types of binders:
      1) an organic or inorganic film-forming polymer that is unreactive with (A);
      2) an organic or inorganic film-forming polymer, which is capable of reacting with (A);
      3) one or more polymer pre-cursors polymerizable on a substrate surface and unreactive to (A);
      4) one or more polymer pre-cursors polymerizable on a substrate surface and capable of reacting with (A); and
   C) optionally, one or more dissolved and/or dispersed additive(s), selected from wax, adhesion promoter, leveling agent, flow modifier, wetting agent, rheology modifier, stabilizer, catalyst, pigment, photoinitiator, biocide and biostat; and
   D) optionally at least one organic solvent.

2. The circuit board water-proofing coating composition of claim 1, wherein the molecule comprising the thio-functional group and/or the azolic moiety; further comprises a secondary functional group.

3. The circuit board water-proofing coating composition of claim 1, wherein at least a portion of the binder component (B) is grafted to at least some molecules of the passivating agent (A).

4. The circuit board water-proofing coating composition of claim 1, wherein the organic or inorganic film-forming polymer of (B) comprises a polymer or copolymer of olefin monomer(s) and vinyl ester(s).

5. The circuit board water-proofing coating composition of claim 1, wherein the one or more polymer pre-cursors comprise UV-curable monomers, oligomers and/or pre-polymers.

6. The circuit board water-proofing coating composition of claim 1, wherein (A) comprises molecules having both a thiol functional group and an azolic moiety.

7. The circuit board water-proofing coating composition of claim 1, wherein (A) comprises a mercapto silane oligomer.

8. The circuit board water-proofing coating composition of claim 1, wherein (C) comprises a wax having a melting point of about 50 to 100° C.

9. The circuit board water-proofing coating composition of claim 1, wherein the one or more polymer pre-cursors (B) is present and includes olefinic monomer comprising at least one of (meth)acrylate monomer(s), a vinyl monomer(s), styrene(s), acrylonitrile(s), and mixtures thereof.

10. A method of waterproofing a circuit board comprising steps of:
   a) applying the coating composition of claim 1 to a substrate surface, wherein the substrate constitutes at least a portion of a circuit board or electronic component, optionally comprising one or more electrically conductive traces affixed thereto;
   b) drying the coating composition on the substrate surface;
   c) optionally UV curing the coating composition on the substrate surface;
   d) during any of steps a)-c) reacting available reactive functional groups of binder component (B) and passivating agent (A) with coating composition components, and optionally the electrically conductive traces, thereby depositing a water-insoluble, passivating polymeric film on the substrate surface.

11. The passivating polymeric film deposited on the substrate surface according to the method of claim 10, wherein the passivating polymeric film is removable from the circuit board by peeling.

12. The passivating polymeric film deposited on the substrate surface according to the method of claim 10, wherein the substrate surface is a tape, backing or other support thereby forming a removable film for later transfer to an end use article.

13. An electronic component comprising the substrate surface coated according to claim 10, wherein the electronic component shows no current leakage during immersion in distilled water for 30 minutes under applied electrical power of 10 Volts.

14. A method of water-proofing a circuit board, the method comprising:
   (a) providing the coating composition of claim 1, wherein the passivating agent(s) (A) is present in the amount of at least 16 wt. % of the composition;
   (b) applying the coating composition onto an exposed surface of the circuit board and maintaining the composition in a liquid state thereby by enabling reaction and adsorption of (A) to metal portions of the surface; and (c) solidifying, and optionally curing, the composition to form an ultra-thin film having a thickness sufficient to render the surface waterproof.

15. A printed circuit board comprising a substrate, electrically conductive traces affixed to the substrate and an adherent passivating polymeric coating adhered to at least one surface of the substrate and electrically conductive traces, the adherent passivating polymeric coating being derived application of the coating composition of claim 1, wherein the adherent passivating polymeric coating comprises:
   a) a cured binder matrix comprising one or more of an organic or inorganic film-forming polymer, optionally cross-linked; reaction products of one or more polymer pre-cursors; and/or reaction products of the film-forming polymer with one or more polymer precursors;
   b) a passivating agent in a concentration greater than a solubility limit of the passivating agent in the binder component such that there is a secondary phase of passivating agent, the passivating agent comprising a thiol group, an azolic moiety, an azole, and combinations thereof; and/or reaction products of the passivating agent with the electrically conductive traces and/or at least a portion of component a); and
   c) optionally particles of wax, insoluble in the cured binder matrix and dispersed therein.

16. The printed circuit board of claim 15 wherein the adherent polymeric coating comprises a polymer made from olefinic monomer comprising at least one of (meth)acrylate monomer(s), a vinyl monomer(s), styrene(s), acrylonitrile(s), and mixtures thereof.

17. The circuit board water-proofing coating composition of claim 1, wherein the coating composition contains no more than 0.001 wt. % fluorine and the at least one dissolved and/or dispersed passivating agent, contains a molecule comprising a thio-functional group.

18. The circuit board water-proofing coating composition of claim 1, wherein the passivating agent (A) is different from the binder component (B); (A) is present in an amount up to about 60 wt. %; (B) is present in an amount of about 1 wt. % to about 97 wt. %; (C) is present in an amount of about 1-80 wt. %; and the remainder to 100 wt. % being (D) at least one organic solvent, all based on a total weight of the coating composition.

19. The circuit board water-proofing coating composition of claim 18, wherein at least a portion of the passivating agent (A) comprises a thiol group; azolic moiety; or azole; and further comprises a secondary functional group.

20. The circuit board water-proofing coating composition of claim 18, wherein the passivating agent (A) is present in an amount of at least 16 wt. % and at least a portion of the binder component (B) is grafted to at least some molecules of the passivating agent (A).

21. The circuit board water-proofing coating composition of claim 4, wherein the polymer or copolymer of olefin monomer(s) and vinyl ester(s) is an ethylene vinyl acetate block copolymer.

22. The circuit board water-proofing coating composition of claim 18, wherein the one or more polymer pre-cursors of (B) are present and comprise UV-curable monomers, oligomers and/or pre-polymers.

23. The circuit board water-proofing coating composition of claim 18, wherein (A) comprises molecules having both a thiol functional group and an azolic moiety.

24. The circuit board water-proofing coating composition of claim 1, wherein (A) comprises a mercapto silane oligomer and (C) comprises a wax.

25. The circuit board water-proofing coating composition of claim 5, wherein the one or more polymer pre-cursors of (B) are present and include olefinic monomer comprising at least one of (meth)acrylate monomer(s), a vinyl monomer(s), styrene(s), acrylonitrile(s), and mixtures thereof.

* * * * *